(12) United States Patent
Kan et al.

(10) Patent No.: US 10,854,798 B2
(45) Date of Patent: Dec. 1, 2020

(54) QUANTUM DOT ENCAPSULATION TECHNIQUES

(71) Applicant: Nanosys, Inc., Milpitas, CA (US)

(72) Inventors: Shihai Kan, San Jose, CA (US); Jay Yamanaga, Campbell, CA (US); Charles Hotz, San Rafael, CA (US); Jason Hartlove, Los Altos, CA (US); Veeral Hardev, Redwood City, CA (US); Jian Chen, Saratoga, CA (US); Christian Ippen, Sunnyvale, CA (US); Wenzhou Guo, San Jose, CA (US); Robert Wilson, Palo Alto, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 16/589,824

(22) Filed: Oct. 1, 2019

(65) Prior Publication Data

US 2020/0035881 A1    Jan. 30, 2020

Related U.S. Application Data

(62) Division of application No. 16/039,893, filed on Jul. 19, 2018, which is a division of application No.
(Continued)

(51) Int. Cl.
*H01L 33/56* (2010.01)
*H01L 51/52* (2006.01)
(Continued)

(52) U.S. Cl.
CPC .............. *H01L 33/56* (2013.01); *B82Y 40/00* (2013.01); *C09K 11/025* (2013.01);
(Continued)

(58) Field of Classification Search
CPC ..... B82Y 40/00; C09K 11/025; C09K 11/565; C09K 11/70; C09K 11/703; C09K 11/883; H01L 33/502; H01L 33/56; H01L 51/5237

See application file for complete search history.

(56) References Cited

U.S. PATENT DOCUMENTS

| | | |
|---|---|---|
| 6,413,489 B1 | 7/2002 | Ying et al. |
| 7,005,669 B1 | 2/2006 | Lee |

(Continued)

FOREIGN PATENT DOCUMENTS

| | | |
|---|---|---|
| EP | 2 853 578 A1 | 4/2015 |
| WO | WO 2014/208456 A1 | 12/2014 |
| WO | WO 2015/109161 A1 | 7/2015 |

OTHER PUBLICATIONS

Koole et al., "On the incorporation mechanism of hydrophobic quantum dots in silica spheres by a reverse microemulsion method." *Chem Mater.* 2008, 20, 2503; 10 pages.

(Continued)

*Primary Examiner* — Allan R Wilson
(74) *Attorney, Agent, or Firm* — Sterne, Kessler, Goldstein & Fox P.L.L.C.

(57) ABSTRACT

Quantum dots and methods of making quantum dots are described. A method begins with forming quantum dots having a core-shell structure with a plurality of ligands on the shell structure. The method includes exchanging the plurality of ligands with a plurality of second ligands. The plurality of second ligands have a weaker binding affinity to the shell structure than the plurality of first ligands. The plurality of second ligands are then exchanged with hydrolyzed alkoxysilane to form a monolayer of hydrolyzed alkoxysilane on a surface of the shell structure. The method
(Continued)

includes forming a barrier layer around the shell structure by using the hydrolyzed alkoxysilane as a nucleation center.

7 Claims, 9 Drawing Sheets

Related U.S. Application Data

15/368,344, filed on Dec. 2, 2016, now Pat. No. 10,056,533.

(60) Provisional application No. 62/262,221, filed on Dec. 2, 2015.

(51) Int. Cl.

| | | |
|---|---|---|
| *H01L 33/50* | (2010.01) | |
| *C09K 11/70* | (2006.01) | |
| *C09K 11/88* | (2006.01) | |
| *C09K 11/02* | (2006.01) | |
| *B82Y 40/00* | (2011.01) | |
| *C09K 11/56* | (2006.01) | |
| *B82Y 20/00* | (2011.01) | |
| *B82Y 30/00* | (2011.01) | |

(52) U.S. Cl.
CPC .......... *C09K 11/565* (2013.01); *C09K 11/70* (2013.01); *C09K 11/703* (2013.01); *C09K 11/883* (2013.01); *H01L 33/502* (2013.01); *H01L 51/5237* (2013.01); *B82Y 20/00* (2013.01); *B82Y 30/00* (2013.01); *Y10S 977/774* (2013.01); *Y10S 977/892* (2013.01); *Y10S 977/95* (2013.01)

(56) References Cited

U.S. PATENT DOCUMENTS

| | | | |
|---|---|---|---|
| 9,005,480 | B2 | 4/2015 | Furuta et al. |
| 10,550,325 | B2* | 2/2020 | Kan .................... C09K 11/883 |
| 2003/0066998 | A1 | 4/2003 | Lee |
| 2007/0057263 | A1 | 3/2007 | Kahen |
| 2008/0302977 | A1 | 12/2008 | Yao et al. |
| 2009/0109435 | A1 | 4/2009 | Kahen et al. |
| 2010/0140586 | A1 | 6/2010 | Char et al. |
| 2011/0089809 | A1* | 4/2011 | Noh ........................ B82Y 20/00 313/483 |
| 2013/0345458 | A1* | 12/2013 | Freeman ................ C08G 77/38 556/12 |
| 2014/0049155 | A1 | 2/2014 | Kurtin |
| 2014/0264189 | A1 | 9/2014 | Furuta et al. |
| 2014/0275598 | A1 | 9/2014 | Freeman et al. |
| 2014/0288351 | A1 | 9/2014 | Jones |
| 2015/0008393 | A1 | 1/2015 | Mangum et al. |
| 2015/0011029 | A1* | 1/2015 | Mangum ................ C09K 11/02 438/22 |
| 2015/0053914 | A1 | 2/2015 | Kurtin et al. |
| 2015/0109814 | A1* | 4/2015 | Chen .................... G02B 6/0073 362/606 |
| 2016/0137916 | A1 | 5/2016 | Wachi |
| 2016/0342282 | A1 | 11/2016 | Wassvik |
| 2017/0096538 | A1* | 4/2017 | Sasaki ..................... B32B 27/32 |
| 2017/0162756 | A1 | 6/2017 | Hartlove et al. |

OTHER PUBLICATIONS

Williams et al., "Relative Fluorescence Quantum Yields Using a Computer-controlled Luminescence Spectrometer", *Analyst* 1983, 108, 1067-1071; 5 pages.

Ziegler et al., "Silica-Coated InP/ZnS Nanocrystals as Converter Material in White LEDs." *Adv. Mater.* 2008, 20, 4068-4073; 6 pages.

International Search Report and Written Opinion directed to related International Patent Application No. PCT/US2016/064720, dated Feb. 23, 2017; 14 pages (Not a Corresponding Application).

International Search Report and Written Opinion directed to related International Patent Application No. PCT/US2016/064722, dated Mar. 29, 2017; 15 pages.

Office Action, dated Dec. 1, 2017, for U.S. Appl. No. 15/368,334, filed Dec. 2, 2016, 9 pages.

Nann, T., et al., "Single Quantum Dots in Spherical Silica Particles," *Angewandte Chemie International Edition*, vol. 43, 2004; pp. 5393-5396.

Wu, S., et al., "Synthesis of mesoporous silica nanoparticles," *Chemical Society Reviews*, vol. 42, 2013; pp. 3862-3875.

* cited by examiner

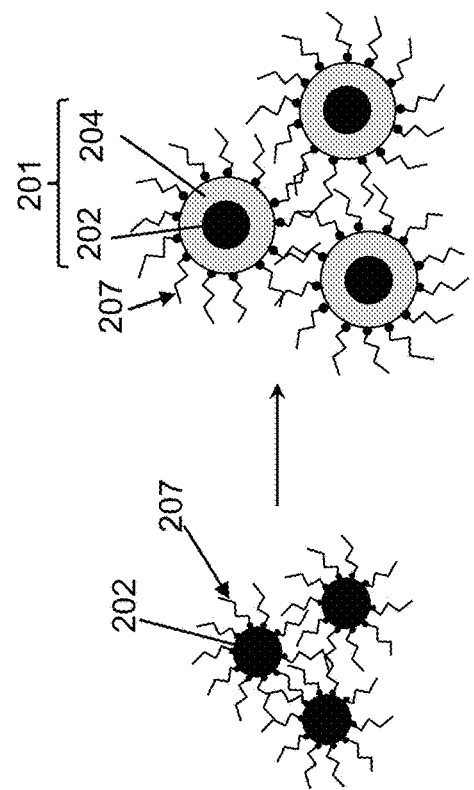
FIG. 2A
FIG. 2B
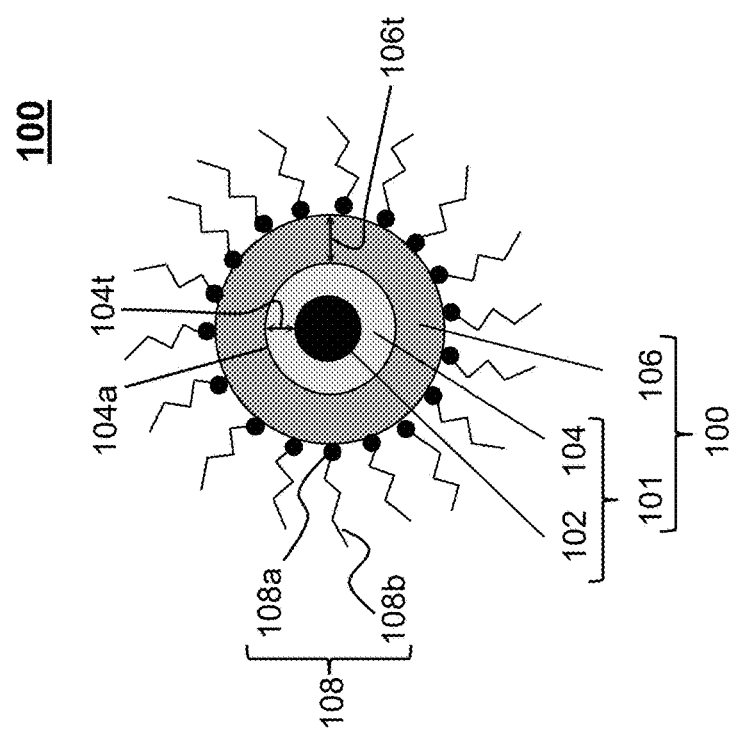
FIG. 1

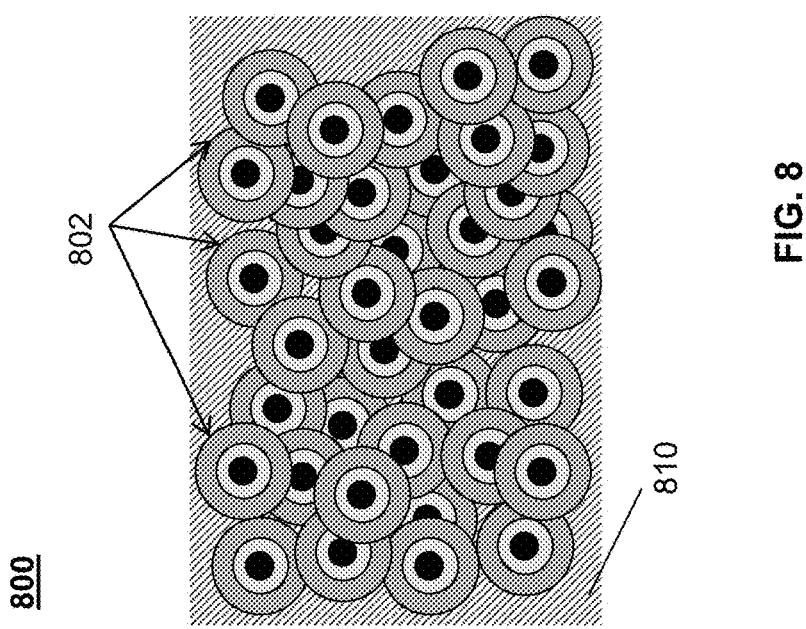
FIG. 8
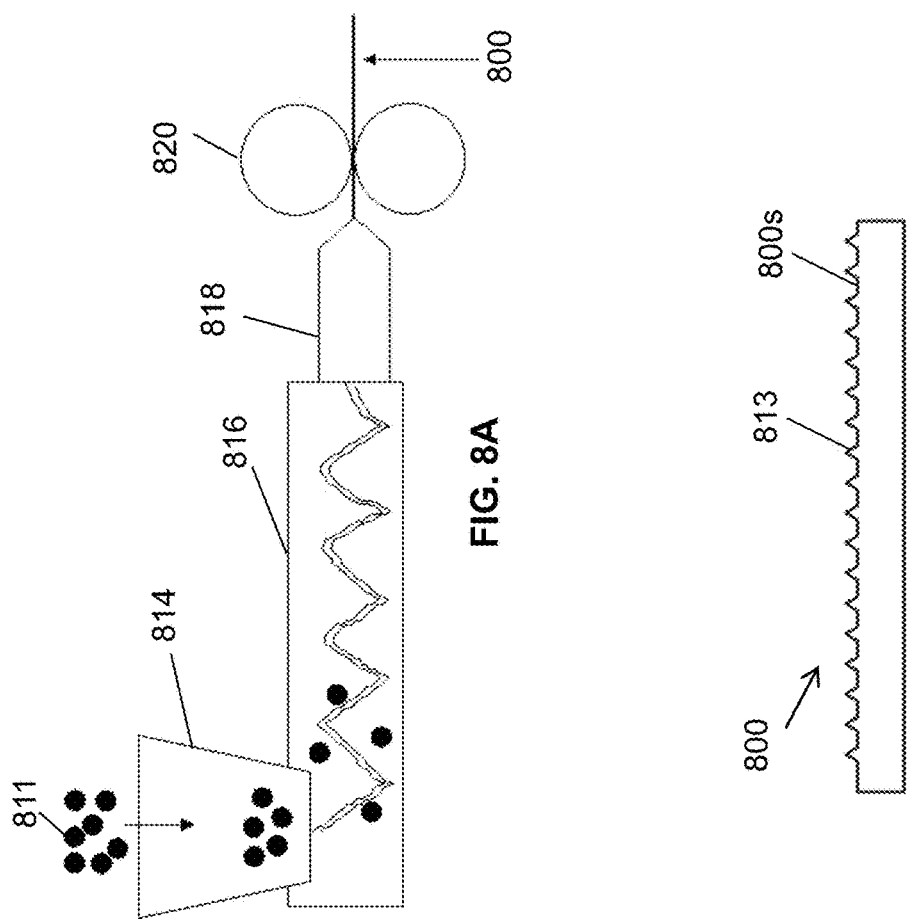
FIG. 8A
FIG. 8B

QUANTUM DOT ENCAPSULATION TECHNIQUES

CROSS REFERENCE TO RELATED APPLICATIONS

The present application is a divisional of U.S. application Ser. No. 16/039,893, filed Jul. 19, 2018, which is a divisional of U.S. application Ser. No. 15/368,344, filed Dec. 2, 2016, now U.S. Pat. No. 10,056,533, which claims priority to U.S. Provisional Appl. No. 62/262,221, filed Dec. 2, 2015, which are incorporated by reference herein in their entireties.

BACKGROUND

Field

The present application relates to display devices including highly luminescent quantum dots (QDs) comprising a core-shell structure.

Background

Quantum dots (QDs) have the unique ability to emit light at a single spectral peak with narrow line width, creating highly saturated colors. It is possible to tune the emission wavelength based on the size of the QDs. This ability to tune the emission wavelength enables display engineers to custom engineer a spectrum of light to maximize both the efficiency and color performance of the display.

The size-dependent properties of QDs are used to produce a QD film. The QD film may be used as a color down conversion layer in display devices. The use of a color down conversion layer in emissive displays can improve the system efficiency by down-converting white light to a more reddish light, greenish light, or both, before the light passes through a color filter. This use of a color down conversion layer may reduce loss of light energy due to filtering.

QDs may be used as the conversion material due to their broad absorption and narrow emission spectra. Because the density of QDs required for such application is very high in a very thin color down conversion layer of about 3 µm-6 µm, QDs prepared using current methods suffer from quenching of their optical properties when the QDs are closely packed next to each other in a thin QD film. As such, current QD-based display devices using QD films as color down conversion layers suffer from low quantum yield (QY).

SUMMARY

Accordingly, there is need to increase the quality of display devices. Disclosed herein are embodiments that may be used to overcome the above mentioned limitations of display devices.

According to an embodiment, a method of making indium phosphide quantum dots includes forming quantum dots having a core-shell structure with a plurality of ligands on the shell structure. The method includes exchanging the plurality of ligands with a plurality of second ligands. The plurality of second ligands have a weaker binding affinity to the shell structure than the plurality of first ligands. The plurality of second ligands are then exchanged with hydrolyzed alkoxysilane to form a monolayer of hydrolyzed alkoxysilane on a surface of the shell structure. The method includes forming a barrier layer around the shell structure by using the hydrolyzed alkoxysilane as a nucleation center.

According to an embodiment, the plurality of first ligands includes carboxylic acid.

According to an embodiment, the plurality of first ligands comprise alkanethiols.

According to an embodiment, the plurality of second ligands comprises oleylamine.

According to an embodiment, the plurality of second ligands comprises aliphatic amines.

According to an embodiment, the plurality of second ligands comprises alkylphosphines.

According to an embodiment, the plurality of second ligands comprises polyethylene glycol alkyl ether or polyethylene glycol aryl ether.

According to an embodiment, the barrier layer comprises an oxide.

According to an embodiment, the barrier layer comprises silicon dioxide.

According to an embodiment, a quantum dot film includes quantum dots where each quantum dot includes a core-shell structure and an optically transparent hydrophobic barrier layer. The core-shell structure has a core that includes indium phosphide (InP) and a shell that includes zinc sulfide (ZnS) or zinc selenide (ZnSe) surrounding the core. The optically transparent hydrophobic barrier layer is disposed on the core-shell structure and surrounds only a single quantum dot. The quantum dot film also includes a matrix material designed to house the quantum dots and be in contact with the optically transparent hydrophobic barrier layer.

According to an embodiment, the optically transparent hydrophobic barrier layer comprises an oxide.

According to an embodiment, the optically transparent hydrophobic barrier layer comprises silicon dioxide.

According to an embodiment, the quantum dot film further includes surfactants disposed on an outer surface of the optically transparent hydrophobic barrier layer.

According to an embodiment, the matrix material includes an extrudable material.

According to an embodiment, the matrix material includes a brightness enhancement film.

According to an embodiment, the matrix material includes a polymer plastic film.

According to an embodiment, the quantum dot film includes a thickness in a range from about 70 µm to about 40 µm.

According to an embodiment, a display device includes an organic layer that emits a broadband radiation during operation and a quantum dot film disposed on the organic layer. The quantum dot film includes quantum dots designed to absorb wavelengths of the broadband radiation that are smaller than a primary emission peak wavelength and, in response, emit at the primary emission peak wavelength. Each of the quantum dots has a core that includes indium phosphide (InP) and a shell that includes zinc sulfide (ZnS) or zinc selenide (ZnSe) surrounding the core, and a hydrophobic barrier layer surrounding the shell, such that the hydrophobic barrier layer surrounds only a single quantum dot. The quantum dot film further includes a matrix material designed to house the barrier layer coated quantum dots and be in contact with the hydrophobic barrier layer. The display device further includes an optical element, disposed on the quantum dot film, designed to block another set of wavelengths of the broadband radiation that are greater than the primary emission peak wavelength.

According to an embodiment, the hydrophobic barrier layer is designed to provide a distance between the shell of one of the quantum dots with the shell of other quantum dots that are in contact with the one of the quantum dots to prevent aggregation.

According to an embodiment, the distance between adjacent barrier layer coated quantum dots is equal or greater than a Forster radius.

According to an embodiment, the organic layer, the quantum dot film, and the optical element are part of a pixel unit of the display device.

According to an embodiment, the optical element is a color filter.

According to an embodiment, the hydrophobic barrier layer includes an oxide.

According to an embodiment, the hydrophobic barrier layer includes silicon dioxide.

According to an embodiment, a light emitting diode (LED) device includes a light source unit, a quantum dot film disposed on the light source unit, and an optical element disposed on the quantum dot film.

According to an embodiment, a method of making the barrier layer coated quantum dots includes forming a solution of reverse micro-micelles using surfactants, incorporating quantum dots into the reverse micro-micelles, individually coating the quantum dots with a barrier layer to form the barrier layer coated quantum dots, and performing an acid etch treatment of the barrier layer coated quantum dots.

According to an embodiment, the method further includes isolating the barrier layer coated quantum dots with the surfactants of the reverse micro-micelles disposed on the barrier layer after the performing of the acid etch treatment.

According to an embodiment, the incorporating of the quantum dots into the reverse micro-micelles includes forming a first mixture of the quantum dots and the solution of reverse micelles.

According to an embodiment, the individually coating of the quantum dots with the barrier layer includes forming a second mixture of a precursor and the first mixture and forming a third mixture of a catalyst and the second mixture.

According to an embodiment, the performing of the acid etch treatment of the barrier layer quantum dots includes forming a fourth mixture of an acid and the third mixture.

According to an embodiment, the performing of the acid etch treatment of the barrier layer quantum dots includes selectively removing the catalyst and forming a fourth mixture of an acid and the third mixture.

According to an embodiment, the acid includes acetic acid, hydrochloric acid, nitric acid, or a fatty acid.

According to an embodiment, the barrier layer coated quantum dots have a quantum yield between 50% to about 70%.

According to an embodiment, a method of making a quantum dot film includes forming barrier layer coated quantum dots, forming a homogenous mixture of the barrier layer quantum dots and a matrix material, and performing an extrusion process on the barrier layer coated quantum dots and a matrix material.

According to an embodiment, the performing of the extrusion process includes introducing the homogenous mixture into a hopper, extruding a film having the barrier layer coated quantum dots and the matrix material through a slot die, and passing the extruded film through chill rolls.

According to an embodiment, the matrix material includes an extrudable material.

According to an embodiment, the matrix material includes a polymer plastic film.

According to an embodiment, the quantum dot film includes a thickness in a range from about 70 μm to about 40 μm.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments and, together with the description, further serve to explain the principles of the present embodiments and to enable a person skilled in the relevant art(s) to make and use the present embodiments.

FIG. 1 illustrates a cross-sectional structure of a barrier layer coated QD, according to an embodiment.

FIGS. 2A-2B illustrate a process of forming core-shell QDs, according to an embodiment.

FIG. 8 illustrates a QD film, according to an embodiment.

FIG. 8A illustrates a method of forming a QD film, according to an embodiment.

FIG. 8B illustrates a cross-sectional view of the QD film of FIG. 8, according to an embodiment.

Figure 3C:
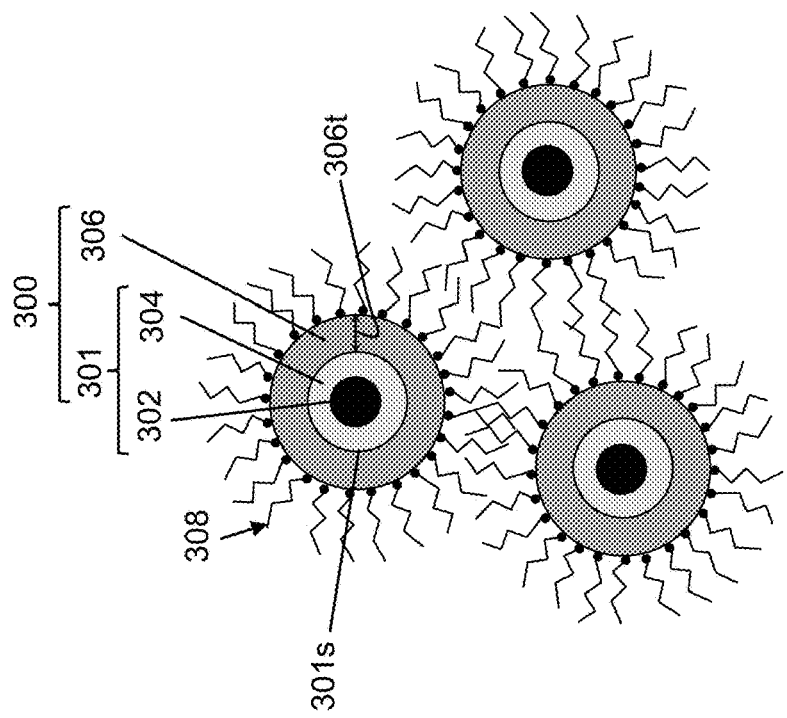
FIGS. 3A-3C illustrate a process of forming barrier layer coated QDs, according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

The term "about" as used herein indicates the value of a given quantity varies by ±10% of the value, or optionally ±5% of the value, or in some embodiments, by ±1% of the value so described. For example, "about 100 nm" encompasses a range of sizes from 90 nm to 110 nm, inclusive.

The term "forming a reaction mixture" or "forming a mixture" as used herein refers to combining at least two components in a container under conditions suitable for the components to react with one another and form a third component.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (or QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to a measure of the size distribution of QDs. The emission spectra of QDs generally have the shape of a Gaussian curve. The width of the Gaussian curve is defined as the FWHM and gives an idea of the size distribution of the QDs. A smaller FWHM corresponds to a narrower size distribution of the QDs. FWHM is also dependent upon the emission wavelength maximum.

An Example Embodiment of a Barrier Layer Coated QD Structure

FIG. 1 illustrates a cross-sectional structure of a barrier layer coated QD 100, according to an embodiment. Barrier layer coated QD 100 includes a QD 101 and a barrier layer 106. QD 101 includes a core 102 and a shell 104. Core 102 includes a semiconducting material that emits light upon absorption of higher energies. Examples of the semiconducting material for core 102 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap may be used as well. In an embodiment, core 102 may also include one or more dopants such as, metals, alloys, to provide some examples. Examples of metal dopant may include, but not limited to, zinc (Zn), Copper (Cu), aluminum (Al), platinum (Pt), chrome (Cr), tungsten (W), palladium (Pd), or a combination thereof. The presence of one or more dopants in core 102 may improve structural and optical stability and quantum yield (QY) of QD 101 compared to undoped QDs.

Core 102 may have a size of less than 20 nm in diameter, according to an embodiment. In another embodiment, core 102 may have a size between about 1 nm and about 5 nm in diameter. The ability to tailor the size of core 102, and consequently the size of QD 101 in the nanometer range enables photoemission coverage in the entire optical spectrum. In general, the larger QDs emit light towards the red end of the spectrum, while smaller QDs emit light towards the blue end of the spectrum. This effect arises as larger QDs have energy levels that are more closely spaced than the smaller QDs. This allows the QD to absorb photons containing less energy, i.e. those closer to the red end of the spectrum.

Shell 104 surrounds core 102 and is disposed on outer surface of core 102. Shell 104 may include cadmium sulfide (CdS), zinc cadmium sulfide (ZnCdS), zinc selenide sulfide (ZnSeS), zinc selenide (ZnSe), and zinc sulfide (ZnS). In an embodiment, shell 104 may have a thickness 104t, for example, one or more monolayers. In other embodiments, shell 104 may have a thickness 104t between about 1 nm and about 5 nm. Shell 104 may be utilized to help reduce the lattice mismatch with core 102 and improve the QY of QD 101. Shell 104 may also help to passivate and remove surface trap states, such as dangling bonds, on core 102 to increase QY of QD 101. The presence of surface trap states may provide non-radiative recombination centers and contribute to lowered emission efficiency of QD 101.

In alternate embodiments, QD 101 may include a second shell disposed on shell 104, or more than two shells surrounding core 102, without departing from the spirit and scope of the present invention. In an embodiment, the second shell may be on the order of two monolayers thick and is typically, though not required, also a semiconducting material. Second shell may provide protection to core 102. Second shell material may be zinc sulfide (ZnS) or zinc selenide (ZnSe), although other materials may be used as well without deviating from the scope or spirit of the invention.

Barrier layer 106 is configured to form a coating on QD 101. In an embodiment, barrier layer 106 is disposed on and in substantial contact with outer surface 104a of shell 104. In embodiments of QD 101 having one or more shells, barrier layer 106 may be disposed on the outermost shell of QD 101. In an example embodiment, barrier layer 106 is configured to act as a spacer between QD 101 and one or more QDs in, for example, a solution, a composition, and/or a film having a plurality of QDs, where the plurality of QDs may be similar to QD 101 and/or barrier layer coated QD 100. In such QD solutions, QD compositions, and/or QD films, barrier layer 106 may help to prevent aggregation of QD 101 with adjacent QDs. Aggregation of QD 101 with adjacent QDs may lead to increase in size of QD 101 and consequent reduction or quenching in the optical emission properties of the aggregated QD (not shown) including QD 101. As discussed above, optical characteristics of QDs are size dependent, and thus increase in QD size due to aggregation leads to the quenching phenomenon. Barrier layer 106 may also prevent QD 101 from reabsorbing optical emissions from other QDs in the QD solutions, QD compositions, and/or QD films and thus, improve the QY of these QD solutions, QD compositions, and/or QD films. In further embodiments, barrier layer 106 provides protection to QD 101 from, for example, moisture, air, and/or harsh environments (e.g., high temperatures and chemicals used during lithographic processing of QDs and/or during manufacturing process of QD based devices) that may adversely affect the structural and optical properties of QD 101.

Barrier layer 106 includes one or more materials that are amorphous, optically transparent and/or electrically inactive. Suitable barrier layers include inorganic materials, such as, but not limited to, inorganic oxides and/or nitrides. Examples of materials for barrier layer 106 include oxides and/or nitrides of Al, Ba, Ca, Mg, Ni, Si, Ti, or Zr, according to various embodiments. Barrier layer 106 may have a thickness 106t ranging from about 8 nm to about 15 nm in various embodiments. In some embodiments, thickness 106t may have a minimum value such that a center-to-center distance between two adjacent QDs 100, for example, in a solution, composition, and/or film is equal to or greater than a Forster radius (also referred in the art as Forster distance) in order to reduce or substantially eliminate resonance energy transfer and/or reabsorption of optical emission between the adjacent QDs 100, and consequently, improve QY of the adjacent QDs 100. In some embodiments, thickness 106t may have a minimum value of between about 8 nm to about 15 nm.

Forster radius may refer to a center-to-center distance between two adjacent QDs, such as QDs 100 at which resonance energy transfer efficiency between these two adjacent QDs is about 50%. Having a center-to-center distance between two adjacent QDs greater than the Forster radius may decrease the resonance energy transfer efficiency and improve the optical emission properties and QY of the adjacent QDs. The process of resonance energy transfer can take place when one QD in an electronically excited state transfers its excitation energy to a nearby or adjacent QD. The resonance energy transfer process is a non-radiative quantum mechanical process. Thus, when the resonance energy transfer occurs from the one QD, the optical emission properties of the one QD may be quenched and the QY of the one QD may be adversely affected.

As illustrated in FIG. 1, barrier layer coated QD 100 may additionally or optionally include a plurality of ligands or surfactants 108, according to an embodiment. Ligands or surfactants 108 may be adsorbed or bound to an outer surface of barrier layer coated QD 100, such as on an outer surface of barrier layer 106, according to an embodiment. The plurality of ligands or surfactants 108 may include hydrophilic or polar heads 108a and hydrophobic or non-polar tails 108b. The hydrophilic or polar heads 108a may be bound to barrier layer 106. The presence of ligands or surfactants 108 may help to separate QD 100 and/or QD 101 from other QDs in, for example, a solution, a composition, and/or a film during their formation. If the QDs are allowed to aggregate during their formation, the quantum efficiency of QDs such as QD 100 and/or QD 101 may drop. Ligands or surfactants 108 may also be used to impart certain properties to barrier layer coated QD 100, such as hydrophobicity to provide miscibility in non-polar solvents, or to provide reaction sites (e.g., reverse micellar systems) for other compounds to bind.

A wide variety of ligands exist that may be used as ligands 108. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is diphenylphosphine.

A wide variety of surfactants exist that may be used as surfactants 108. Nonionic surfactants may be used as surfactants 108. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants may also be used as surfactants 108. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, QDs 101 and/or 100 may be synthesized to emit light in the red, orange, and/or yellow range. In some embodiments, QDs 101 and/or 100 may be synthesized emit light in the green and/or yellow range. In some embodiments, QDs 101 and/or 100 may be synthesized emit light in the blue, indigo, violet, and/or ultra-violet range. In some embodiments, QDs 101 and/or 100 may be synthesized to have a primary emission peak wavelength between about 605 nm and about 650 nm, between about 510 nm and about 550 nm, or between about 300 nm and about 480 nm.

QDs 101 and/or 100 may be synthesized to display a high QY. In some embodiments, QDs 101 and/or 100 may be synthesized to display a QY between 80% and 95% or between 85% and 90%.

Thus, according to various embodiments, QDs 100 may be synthesized such that the presence of barrier layer 106 on QDs 101 does not substantially change or quench the optical emission properties of QDs 101.

QY of QDs may be calculated using an organic dye as a reference (e.g., rhodamine 640 as a reference for red-emitting QDs 101 and/or 100 at the 530 nm excitation wavelength, fluorescein dye as a reference for green-emitting QDs 101 and/or 100 at the 440 nm excitation wavelength, 1,10-diphenylanthracene as a reference for blue-emitting QDs 101 and/or 100 at the 355 nm excitation wavelength based on the following equation:

$$\Phi_X = \Phi_{ST}\left(\frac{Grad_X}{Grad_{ST}}\right)\left(\frac{\eta_X^2}{\eta_{ST}^2}\right).$$

The subscripts ST and X denote the standard (reference dye) and the core/shell QDs solution (test sample), respectively. $\Phi_X$ is the quantum yield of the core/shell QDs, and $\Phi_{ST}$ is the quantum yield of the reference dye. Grad=(I/A), where I is the area under the emission peak (wavelength scale); A is the absorbance at excitation wavelength. η is the refractive index of the reference dye or the core/shell QDs in the solvent. See, e.g., Williams et al. (1983) "Relative fluorescence quantum yields using a computer controlled luminescence spectrometer" *Analyst* 108:1067. The references listed in Williams et al. are for green and red emitting QDs.

An Example Method for Forming a Core-Shell QDs

FIGS. 2A-2B illustrates different stages of formation of QDs 201, according to an embodiment. QDs 201 may be similar to QD 101, as described above. It should be noted that formation of three QDs has been shown in FIGS. 2A-2B for illustrative purposes. However, as would be understood by a person of skill in the art based on the description herein, the methods described below can produce any number of QDs similar to QDs 201.

Cores formation—FIG. 2A illustrates QDs 201 after formation of cores 202 and native ligands or surfactants 207, according to an embodiment. Cores 202 and native ligands 207 may be similar to core 102 and ligands 108, respectively. In an embodiment, cores 202 having native ligands or surfactants 207 attached to their outer surface may be formed using a solution-phase colloidal method. The colloidal method may include forming a first mixture comprising one or more cation precursors, one or more anion precursors, and a solvent. The method may further include heating a solution of one or more ligands or surfactants at a first temperature and forming a second mixture by rapidly injecting the first mixture into the heated solution of one or more ligands or surfactants, followed by heating the second mixture at a second temperature. The one or more ligands or surfactants can be any of the ligands or surfactants discussed above. In some embodiments, the first temperature is between about 200° C. and about 400° C. and in some embodiments, the second temperature is between about 150° C. and about 350° C. The first temperature may be selected to be sufficient enough to induce a reaction between the cation precursors and the anion precursors. The cation and anion precursors may react to form nuclei of reaction products.

After this initial nucleation phase, growth of cores 202 from the nuclei may occur through addition of monomers, which are present in the second mixture, to the nuclei at the second temperature that is lower than the first temperature. The growth of cores 202 may be stopped by removing the heating at the second temperature after a desired size and/or shape is achieved. This heating process at the second temperature may last from about 1 min to about 120 min. The size and/or shape of the resulting cores 202 may be controlled by manipulating, independently or in combination, parameters such as the temperature, types of precursor materials, and ratios of ligands or surfactants to monomers, according to various example embodiments. The size and/or shape of the resulting cores 202 may be determined using techniques known to those of skill in the art. In some embodiments, the size and/or shape is determined by comparing the diameter of cores 202 before and after the addition of monomers. In some embodiments, the diameter of cores 202 before and after the addition of monomers is determined by transmission electron microscopy (TEM).

After the growth of cores 202 to a desired size and/or shape, they can be cooled. In some embodiments, cores 202 are cooled to room temperature. In some embodiments, an organic solvent is added to dilute the second mixture comprising cores 202. In some embodiments, the organic solvent is hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, after the growth of cores 202 to a desired size and/or shape, they are isolated. In some embodiments, cores 202 are isolated by precipitating them from the solvent of the second mixture or of the diluted second mixture. In some embodiments, cores 202 are isolated by flocculation with methanol, ethanol, isopropanol or n-butanol.

Examples of the ligands used in the first mixture include dodecylamine (DA), hexadecylamine (HA), octadecylamine (OA), stearic acid (SA), lauric acid (LA), hexylphosphonic acid (HPA), tetrad-ecylphosphonic acid (TDPA), trioctylphosphine (TOP), or trioctylphosphine oxide (TOPO). In an embodiment, the ligand and the solvent may be the same chemical used in the first mixture. For example, long-chain fatty acids and amines and TOPO may serve both the solvent and the ligand functions.

Shelling process—The core formation process may be followed by a shelling process of QDs 201, as illustrated in FIG. 2B. FIG. 2B illustrates QDs 201 after formation of shells 204. Shells 204 may be similar to shell 104, as described above. The process of forming shells 204 around cores 202 may include suspending cores 202 in a solvent or a mixture of solvents such as, but not limited to, 1-octadecene, 1-decene, 1-dodecene, or tetradecane, and heating the suspension of cores 202 at a third temperature. In some embodiments, the third temperature is between 100° C. and about 200° C. The shelling process may further include forming a third mixture by adding precursors that include elements of shells 204 at a third temperature. In some embodiments, the third temperature is between 250° C. and about 350° C. For example, cadmium precursor and sulfur precursor may be used in the third mixture for forming shells 204 comprising cadmium sulfide (CdS). In an example, shells 204 include group III-V material or group II-VI material. In another example, elements of shells 204 may be different from elements of cores 202. The materials of cores 202 and shells 204 may be selected such that the two materials have a low lattice mismatch between them. The low lattice mismatch may allow the formation of a uniform and epitaxially grown shells 204 on the surfaces of cores 202. In this method of first shell formation, cores 202 may act as the nuclei, for shells 204 to grow from their surface.

The growth of shells 204 on cores 202 may be stopped by removing the heating at the third temperature after a desired thickness of shells 204 on cores 202 is achieved. This heating process at the third temperature may last from about 50 min to about 100 min. The thickness of the resulting shells 204 may be controlled by manipulating, independently or in combination, parameters such as the temperature, types of precursor materials, and amount of precursors, according to various example embodiments.

After the growth of shells 204 to a desired thickness, the resulting core-shell QDs 201 can be cooled. In some embodiments, QDs 201 are cooled to room temperature. In some embodiments, after the formation of QDs 201, they are isolated. In some embodiments, QDs 201 are isolated by precipitation with a solvent (e.g., ethanol) and centrifugation.

The resulting core-shell QDs 201 may have a narrow size distribution (i.e., a small FWHM) and a high QY. In some embodiments, the photoluminescence spectrum of core-shell QDs 201 have a FWHM in a range from about 20 nm and 40 nm, from about 22 nm and 40 nm from about 24 nm and 40 nm, from about 26 nm and 40 nm, from about 28 nm and 40 nm, from about 20 nm and 36 nm, from about 20 nm and 34 nm, or from about 20 nm and 30 nm.

In some embodiments, core-shell QDs 201 may be synthesized to emit light in the red, orange, and/or yellow range. In some embodiments, core-shell QDs 201 may be synthesized to emit light in the green and/or yellow range. In some embodiments, core-shell QDs 201 may be synthesized to emit light in the blue, indigo, violet, and/or ultra-violet range. In some embodiments, core-shell QDs 201 may be synthesized to have a primary emission peak wavelength between about 605 nm and about 650 nm, between about 510 nm and about 550 nm, or between about 300 nm and about 480 nm.

An Example Method for Forming Barrier Layer Coated Core-Shell QDs

Figure 3B:
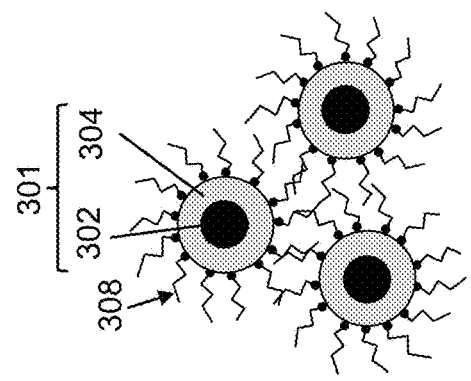
Figure 3A:
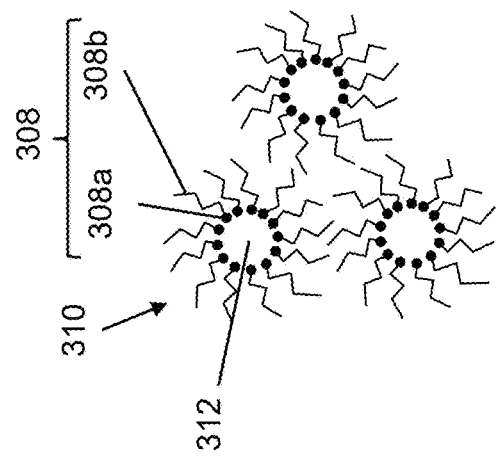

FIGS. 3A-3C illustrates formation of a barrier layer 306 on each of core-shell QDs 301 to form barrier layer coated core-shell QDs 300, according to an embodiment. Barrier layer 306 may be similar to barrier layer 106 and QDs 300 may be similar to QDs 100 described above. In an embodiment, the method of forming barrier layer 306 is based on a reverse emulsion method that includes formation of reverse micro-micelles 310. These reverse micro-micelles 310 may serve as reaction centers for coating of core-shell QDs 301 with barrier layer 306. In an embodiment, formation of barrier layer 306 may involve formation of reverse micro-micelles 310, incorporation of core-shell QDs 301 into reverse micro-micelles 310, and a coating process of the incorporated core-shell QDs 301, as described below. In some embodiments, formation of QDs 300 may additionally or optionally include an acid etch treatment performed after the coating process, that is after the formation of barrier layer 306. QDs 301 having a core 302 and one or more shells 304 may be similar to core-shell QDs 101, 201 described above. Core 302 may be similar to cores 102, 202, and one or more shells 304 may be similar to shell 104, 204 described above.

Reverse micro-micelles formation—FIG. 3A illustrates reverse micro-micelles 310 formed in a reverse emulsion (not shown), according to an embodiment. Formation of reverse micro-micelles 310 may include forming a reverse emulsion and adding surfactants 308 in the reverse emulsion. The emulsion may be formed by mixing two immiscible liquids such as a hydrophilic polar solvent and a hydrophobic non-polar solvent, according to an embodiment. Water may be used as a polar solvent and a hydrocarbon may be used as a hydrophobic non-polar solvent. Examples of hydrocarbon that can be used as a hydrophobic non-polar solvent include cyclopentane, cyclohexane, cycloheptane, toluene, or hexane. The two immiscible liquids in the reverse emulsion tend to separate into two distinct phases, a continuous phase and a non-continuous phase, due to their immiscibility with each other. In some embodiments, the two distinct phase are a continuous non-aqueous phase (e.g., hydrocarbon phase) and a non-continuous aqueous phase.

In some embodiments, the two distinct phases in the reverse emulsion may be stabilized by the addition of surfactants 308 to form a first mixture. Surfactants 308 may be similar to surfactants 108. Some examples of surfactants 308 include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), polyoxyethylene branched nonylcyclohexyl ether (Triton N-101), sodium dioctyl sulfosuccinate, sodium stearate, sodium lauryl sulfate, sodium monododecyl phosphate, sodium dodecylbenzenesulfonate, and sodium myristyl sulfate.

Surfactants 308 may help to stabilize the non-continuous aqueous phase by forming a dispersion of reverse micro-micelles 310 in the reverse emulsion to isolate the non-continuous aqueous phase into regimes of aqueous phases within cores 312 of reverse micro-micelles 310. Each of the reverse micro-micelles 310 may be formed by a group of surfactants from among surfactants 308 added into the reverse emulsion. In some embodiments, each of the reverse micro-micelles 310 includes a hydrophilic portion formed by hydrophilic polar groups 308a (sometimes referred to as heads in the art) of surfactants 308 and a hydrophobic portion formed by hydrophobic non-polar groups 308b (sometimes referred to as tails in the art) of surfactants 308. In each of reverse micro-micelles 310, hydrophilic polar heads 308a soluble in the aqueous phase may form a hydrophilic shell around the aqueous phase contained within each of reverse micro-micelle cores 312 and corresponding hydrophobic non-polar tails 308b soluble in the continuous non-aqueous phase may form a hydrophobic shell surrounding the hydrophilic shell. In some embodiments, reverse micelles 310 have a spherical shape and the size of reverse micelles 310 can be controlled by manipulating the type and/or amount of surfactants 308 added in the reverse emulsion.

Incorporation of core-shell QDs into reverse micro-micelles—The formation of reverse micro-micelles 310 may be followed by incorporation of core-shell QDs 301 into cores 312 of reverse micro-micelles 310, as illustrated in FIG. 3B. In an embodiment, this incorporation process includes forming a QD solution having core-shell QDs 301 dispersed in a solvent (e.g., cyclohexane, toluene, or hexane). The QD solution may be formed in a process similar to that described above with reference to QDs 201. The incorporation process further includes forming a second mixture of the QD solution and the first mixture having reverse micro-micelles 310, according to an embodiment.

Similar to QDs 201 described above, QDs 301 may have native ligands or surfactants 207 bonded on the outer surface of the outermost shell 304 before adding to the reverse emulsion. In some embodiments, these native ligands or surfactants 207 of QDs 301 have hydrophilic groups, which causes QDs 301 in the second mixture to be drawn to the aqueous phases isolated within cores 312 of reverse micro-micelles 310 and be enclosed within cores 312, as illustrated in FIG. 3B. Native ligands or surfactants 207 may be dynamically bonded to QDs 301, i.e. the native ligands or surfactants are bonded to QDs 301 in an on-and-off fashion, which may provide the opportunity for native ligands or surfactants 207 to be substituted by surfactants 308. The binding affinity of these native ligands 207 to the outer surface of outermost shell 304 will impact the ability to form barrier layer 306 when QDs 301 are enclosed within cores 312. According to an embodiment, native ligands 207 are exchanged with hydrolyzed alkoxysilane, $(RO)_3SiOH$, to form a monolayer of hydrolyzed alkoxysilane on the outer surface of outermost shell 304. This monolayer of hydrolyzed alkoxysilane acts as a nucleation site for the growth of barrier layer 306 as discussed below.

Each of these QD-filled reverse micro-micelles 310 in the second mixture provide an environment or a reaction center for the formation of barrier layer 306 on each of the QDs 301 enclosed within the reverse micro-micelles 310. In some embodiments, each of the reverse micro-micelles 310 enclose one of the QDs 301 in the second mixture. Such one-in-one incorporation of QDs 301 into reverse micro-micelles 310 may help to prevent aggregation of the QDs 301 with each other and allow individual coating of the QDs 301 with a barrier layer 306. It should be noted that even though FIG. 3A-3B illustrates an equal number of QDs 301 and reverse micro-micelles 310, a person skilled in the art would understand based on the description herein that in some embodiments the number of reverse micro-micelles, similar to reverse micro-micelles 310, formed in the reverse emulsion may be greater than the number of core-shell QDs, similar to core-shell QDs 301, added to the reverse emulsion. In such embodiments, some of the reverse micelles may remain empty of core-shell QDs.

Figure 5B:
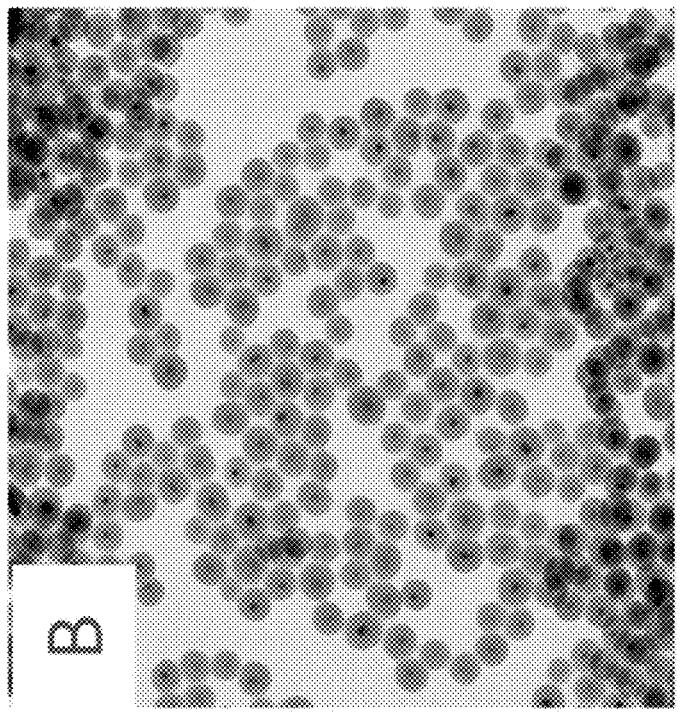
FIGS. 5A-5D illustrate transmission electron micrographs of barrier layer coated indium phosphide QDs, according to an embodiment.
Figure 5A:
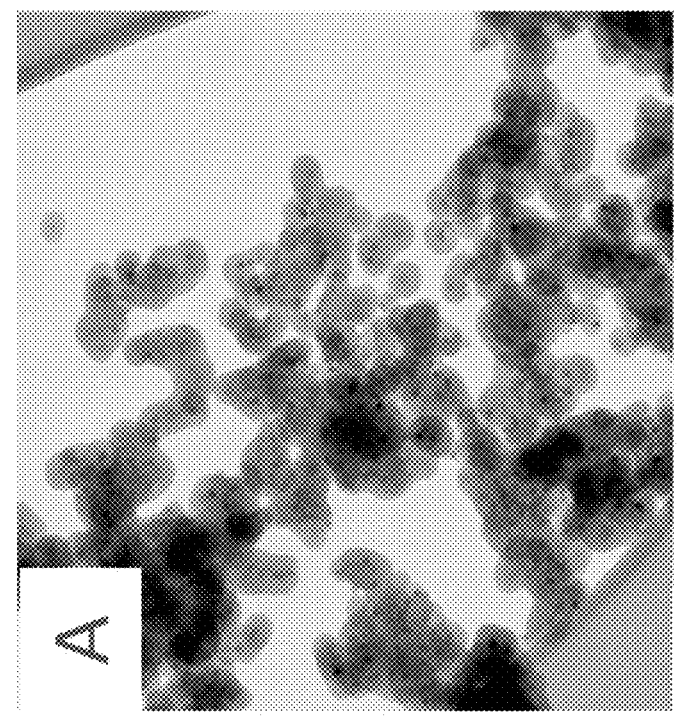
Figure 5D:
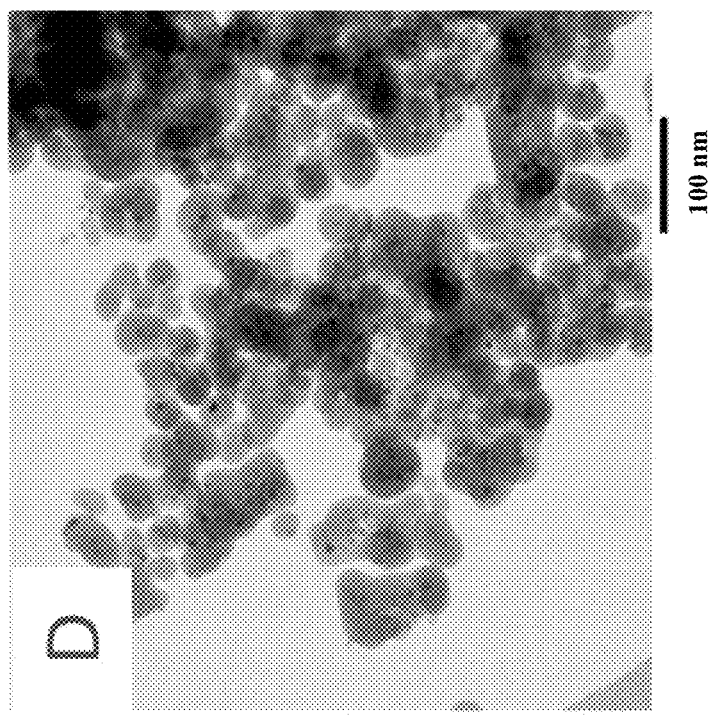
Figure 5C:
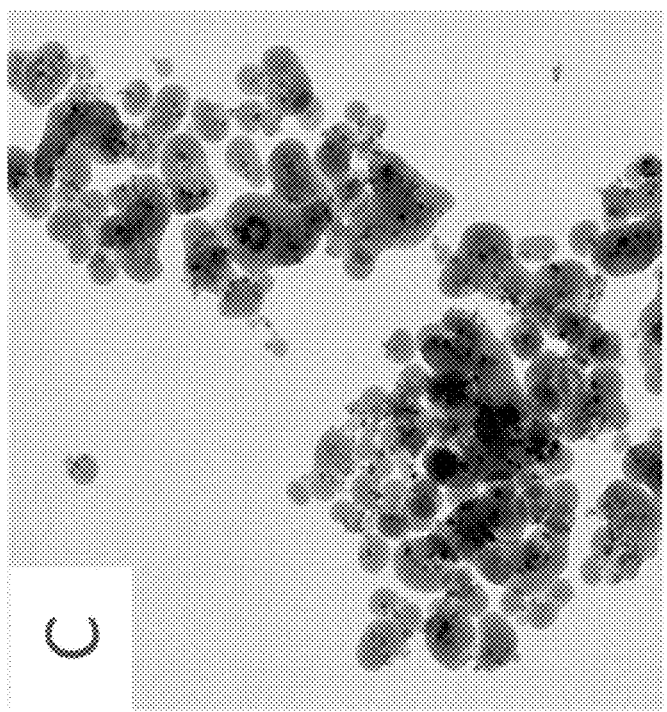

Barrier Layer formation—According to an embodiment, following the incorporation of QDs 301 into the reverse micro-micelles 310 in the second mixture, barrier layer 306 is formed on each of the incorporated QDs 301, as illustrated in FIG. 5C. In an embodiment, the formation of barrier layer 306 includes forming a third mixture of one or more precursors that have elements of barrier layer 306 and the second mixture. For example, Al, Ba, Ca, Mg, Ni, Si, Ti, or Zr precursor may be added to the second mixture for forming barrier layer 306 comprising oxides and/or nitrides of Al, Ba, Ca, Mg, Ni, Si, Ti, or Zr. In some embodiments, tetraethyl orthosilicate (TEOS), tetramethyl orthosilicate, tetrapropyl orthosilicate, or tetrabutyl orthosilicate is used as a Si precursor. The one or more precursors may be prepared as a solution and added into the second mixture at a rate between about 6 mL/min and 8 mL/min, while the second mixture may be rigorously stirred.

The formation of barrier layer 306 further includes forming a fourth mixture of one or more catalysts and the third mixture, according to an embodiment. In an embodiment, ammonia is added as a catalyst to the third mixture. The one or more catalysts may be prepared as a solution and added into the third mixture at a rate between about 4 mL/min and 7 mL/min, while the third mixture may be rigorously stirred. Both the added precursors and catalysts are drawn to QDs 301 in the aqueous phase of reverse micelles 310 due to their affiliation with the hydroxyl (OH) group. Once the added precursor and catalysts are enclosed with a corresponding one of the QDs 301 within each of the reverse micelles 310, the added one or more precursors undergo catalyzed hydrolysis to transform into an intermediate form, which further undergo condensation to form an individual coating of barrier layer 306 around the corresponding one of the QDs 301. In some embodiments surfactants 308 bonded to QDs 301 are completely substituted by hydrolyzed silicon precursors to form a monolayer of hydrolyzed silicon precursors. In an example, once a Si precursor such as TEOS and ammonia catalyst are drawn into and enclosed with a corresponding one of the QDs 301 within reaction center provided by each of the reverse micro-micelles 310, TEOS undergoes ammonia catalyzed hydrolysis to transform into an intermediate form, tetrahydroxysilane, which further undergoes condensation to form an individual coating of $SiO_2$ barrier layer 306 around the corresponding one of the QDs 301. In some embodiments, this hydrolysis and condensation of the one or more precursors added is performed without stirring and/or heating the fourth mixture. In some embodiments, this hydrolysis and condensation reaction may be allowed to occur from about 1 day to about 7 days until substantially all of the one or more precursors in the fourth mixture are used up.

For example, the monolayer of hydrolyzed alkoxysilane (not shown) on the surface of outermost shell 304 undergoes further hydrolysis to eventually form $Si(OH)_4$. These hydrolyzed TEOS will be linked to each other through Si—O—Si bounds to form barrier layer 306 as a condensed solid $SiO_2$ layer around QDs 301. The process continues to form a thick shell of $SiO_2$ until TEOS runs out.

The thickness of the barrier layer 306 formed may be controlled by manipulating, independently or in combination, parameters such as the amount of precursor, the concentration of QDs, and the hydrolysis and condensation reaction time. In an embodiment, increasing the concentration or number of QDs 301 in the second mixture for the same amount of precursors in the third mixture may reduce the thickness of the barrier layer 306.

In alternate embodiments, the amount of the one or more precursors that may be needed to achieve the desired thickness of barrier layer 306 is added in two or more stages of the barrier layer growth process. For example, a portion of the precursor amount may be added to the second mixture to make the third mixture and the remaining portion of the precursor amount may be added to the fourth mixture after the precursors of the third mixture has been used up during the hydrolysis and condensation reaction.

Barrier layer 306 may be grown to a thickness 306$t$ ranging from about 8 nm to about 15 nm in various embodiments. In some embodiments, thickness 306$t$ may have a minimum value such that a center-to-center distance between two adjacent QDs 300, for example, in a solution, composition, and/or film is equal to or greater than a Forster radius (also referred in the art as Forster distance). In some embodiments, thickness 306$t$ may have a minimum value of between about 8 nm to about 15 nm.

Acid Etch Treatment—After the growth of barrier layer 306 to a desired thickness, an acid etch treatment may be performed on QDs 300, according to an embodiment. In some embodiments, one or more acids may be added to the fourth mixture to form a fifth mixture. Examples of the one or more acids include acetic acid, hydrochloric acid, nitric acid, a fatty acid, or a combination thereof. In some embodiments, the molar ratio in a range from about 1.5 to about 10 may be maintained between the one or more acids and the one or more catalysts in the fifth mixture. In one embodiment, the molar ratio of about 2 may be maintained between acetic acid and ammonium hydroxide catalyst in the fifth mixture. The etching process in the fifth mixture may be performed for a time period ranging from about 5 minutes to about 2 days. The acid etch rate may be varied by varying the concentration of the one or more acids added to the fourth mixture, etching temperature, molar ratio between the one or more acids to the one or more catalysts, and/or thickness of barrier layer 306.

This post-coating acid etch treatment of QDs 300 may help to substantially reduce quenching in the optical emission properties of QDs 301. Such optical quenching may be due to reaction of QDs 301 with chemicals used during processing (e.g., catalyst used during barrier layer coating process) on QDs 301 prior to the etching process. For example, the use of ammonium hydroxide catalyst may create coordinating sites on surfaces 301$s$ of QDs 301 for $OH^-$ and $NH_4^+$ ions. These ions may serve as photoelectron trap sites on surfaces 301$s$, and the photoelectron trap sites may induce quenching in the optical emission properties of QDs 301. The etching of surfaces 301$s$ during the acid etch treatment may help to etch off such photoelectron trap sites and/or other trap sites and/or defects on surfaces 301$s$ of QDs 301 that induce optical quenching of QDs 301, and consequently, substantially reduce quenching in the optical emission properties of QDs 301. The acid etch treatment of barrier layer coated QDs 300 may be continued until QY of QDs 300 is substantially similar to QY of uncoated QDs 301. That is the acid etch treatment may be continued until negative effects of processing on QDs 301 (e.g., negative effects of buffered barrier layer coating process) are substantially reduced.

It should be noted that even though barrier layers 306 may be present on QDs 301, acid molecules or $H^+$ ions from the one or more acids in the fifth mixture can penetrate through barrier layer 306, which are porous, and arrive at surfaces 301$s$.

In some embodiments, the acid etch treatment may be performed on QDs 301 prior to and post the barrier layer 306 formation process.

In some embodiments, the one or more catalysts (e.g., ammonium hydroxide) may be selectively removed, for example by evaporating before adding the one or more acids (e.g., acetic acid) to the fourth mixture to form the fifth mixture for the acid etch treatment of QDs 300.

The acid etch treatment may be followed by removal of the solvent, the unreacted one or more precursors, the one or more catalysts, and reaction byproducts are removed from the fifth mixture. In some embodiments, the solvent, unreacted precursors, and reaction byproducts may be removed by evaporation at a temperature between about 40° C. and about 60° C. under vacuum. The resulting concentrate after removal of the solvent and precursors may be further dried at a temperature between about 50° C. and about 70° C. under vacuum for about 60 min to about 90 min. In some embodiments, the resulting barrier layer coated core-shell QDs 300 may be isolated after the acid etch treatment by precipitation with a solvent (e.g., ethanol) and centrifugation and re-dispersed in a hydrophobic solvent such as but not limited to toluene.

In an embodiment, removing the solvent, the unreacted one or more precursors, the one or more catalysts, and reaction byproducts by vacuum evaporation at a mild temperature between about 40° C. and about 60° C. may ensure that surfactants 308 remain bonded to the outer surface of QDs 300 as illustrated in FIG. 5C. The hydrophobic tails 308b of surfactants 308 on barrier layer 306 provide a hydrophobic shell that ensures the dispersability of the resulting dried and isolated QDs 300 in hydrophobic environments (e.g., toluene, photoresist materials) for compatibility with, for example, device fabrication processes without adversely affecting the optical properties of the QDs 300, according to an embodiment.

The isolated and re-dispersed QDs 300 may have a narrow size distribution (i.e., a small FWHM) and a high QY similar to QDs 301. In some embodiments, the photoluminescence spectrum of both QDs 301 and 300 have a FWHM in a range from about 20 nm and 40 nm, from about 22 nm and 40 nm from about 24 nm and 40 nm, from about 26 nm and 40 nm, from about 28 nm and 40 nm, from about 20 nm and 36 nm, from about 20 nm and 34 nm, or from about 20 nm and 30 nm.

In some embodiments, barrier layer coated QDs 300 subjected to acid etch treatment display a QY that is about 10% to about 20% higher than QY displayed by barrier layer coated QDs without acid etch treatment.

An Example Method for Forming Oxide Coated InP-Based QDs

The following example method demonstrates growth of highly luminescent InP/ZnS, InP/ZnSe, or InP/ZnSe/ZnS QDs (also referred herein as InP-based QDs). Oxide coated InP-based QDs may be similar to QDs 100 and/or 300, according to an embodiment. The oxide coated InP-based QDs have a core/shell structure that may be similar to QDs 101, 201, and/or 301 and also have a $SiO_2$ barrier layer that may be similar to barrier layer 106 and/or 306 described above.

Formation of InP-based QDs—These QDs were prepared using the example methods for forming core-shell QDs described above. The InP-based QDs may include a shell of zinc sulfide (ZnS), a shell of zinc selenide (ZnSe), or a double shell configuration having both ZnSe and ZnS layers (ZnSe/ZnS).

Ligand exchange procedure—The native ligands are strongly bound to the zinc-containing shell of the InP-based QDs. This is due to the fact that zinc is a strong Lewis acid while the native ligands, such as carboxylic acid or alkanethiols, are strong Lewis bases. This strong binding affinity can cause problems with the formation of the barrier layer, since the strongly bound ligands cannot be easily exchanged with hydrolyzed alkoxysilane. According to an embodiment, the native ligands are first exchanged with a more weakly bound ligand before exchanging with hydrolyzed alkoxysilane.

Figure 4C:
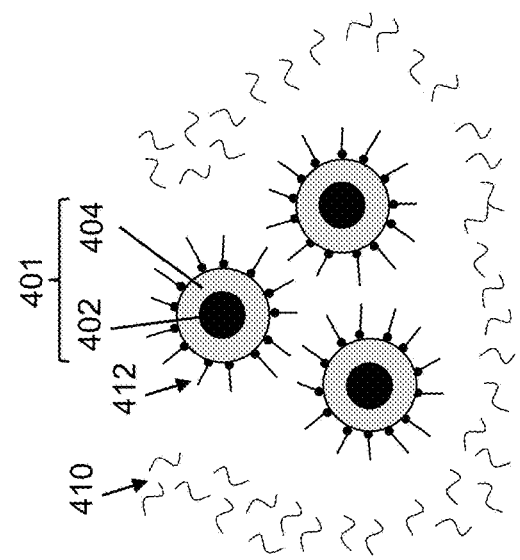
FIGS. 4A-4C illustrate a process of ligand exchange on indium phosphide QDs, according to an embodiment.
Figure 4B:
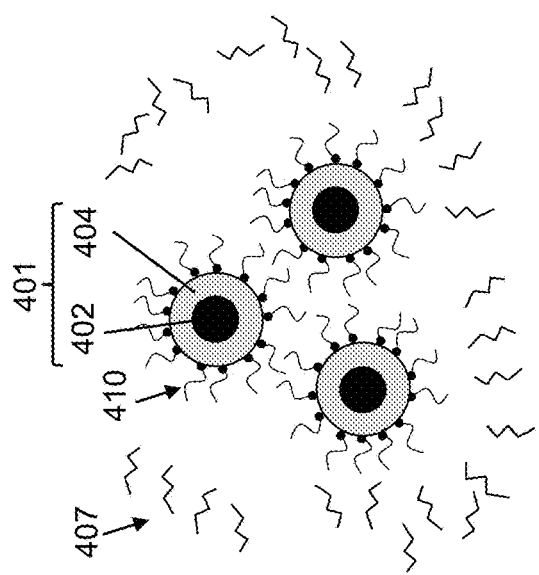
Figure 4A:
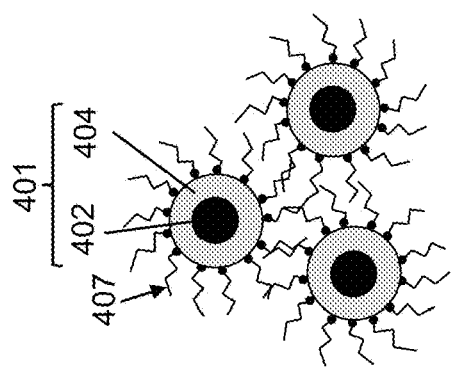

This ligand exchange procedure is shown schematically in FIGS. 4A-4C. This ligand exchange procedure may occur after the formation of QDs 201 shown in FIG. 2B, and before the QDs are incorporated within micro-micelles 310 as shown in FIG. 3B. In another example, this ligand exchange procedure occurs after the QDs are incorporated within micro-micelles 310 as shown in FIG. 3B, but before the growth of barrier layer 306 as shown in FIG. 3C.

Starting at FIG. 4A, InP-based QDs 401 include a core 402 of InP and shell 404 of ZnS or ZnSe, according to some embodiments. Native ligands 407 are bound to an outer surface of shell 404. Native ligands 407 may include carboxylic acids (such as hexanoic acid, lauric acid, or oleic acid) or alkanethiols (such as octanethiol or dodecanethiol) and are typically used to achieve high photoluminescence efficiency. The QDs illustrated in FIG. 4A may be similar to those previously described in FIG. 2B.

FIG. 4B illustrates a first ligand exchange process, according to an embodiment. In the first ligand exchange, native ligands 407 are replaced with a plurality of second ligands 410. According to an embodiment, plurality of second ligands 410 have a weaker binding affinity to shell 404 than native ligands 407. Plurality of second ligands 410 may include oleylamine, aliphatic amines, alkylphosphines, or polyethyleneglycol.

In order for weaker-binding ligands to replace stronger-binding ligands, a favorable condition may be created to move the ligand exchange equilibrium forward. This may include increased concentration of the weaker ligands, reduced concentration of the stronger ligands, and/or elevated temperature, etc. Some example processes for replacing native ligands 407 with plurality of second ligands 410 are described below.

Ligand Exchange Example 1

A 20 mL quantum dot growth solution containing 100 nano-mole of quantum dots is diluted with 20 mL toluene. The QDs are precipitated by mixing with 40 mL ethanol. The precipitated QDs are then isolated by centrifugation, and resuspended in 40 mL toluene. Then, 5 mL of oleylamine is added to this solution and the mixture is heated at 110° C. under nitrogen for 2 hours and cooled down to room temperature. Then the QDs are precipitated for the second time by mixing with 90 mL ethanol. After centrifugation, the precipitated QDs are resuspended in 20 mL cyclohexane. In this example, the concentration of the native (stronger) ligands is greatly reduced by the first precipitate step. The concentration of the added weaker ligands (e.g., oleylamine) is much higher.

Ligand Exchange Example 2

A 20 mL quantum dot growth solution containing 100 nano-mole of quantum dots is diluted with 20 mL toluene. The QDs are precipitated by adding 40 mL ethanol into the solution. The precipitated QDs are then isolated by centrifugation, and resuspended in 40 mL toluene. Then, 10 mL of polyoxyethylene (5) nonylphenylether (NP-5) is added to this solution and the mixture is heated at 110° C. under nitrogen for 2 hours. Then the QDs are precipitated for the second time by adding 50 mL ethanol. After centrifugation, the precipitated QDs are resuspended in 10 mL cyclohexane. In this example, the concentration of the native (stronger) ligands is greatly reduced by the first precipitate step. The concentration of the added weaker ligands (e.g., polyoxyethylene (5) nonylphenylether (NP-5)) is much higher.

Ligand Exchange Example 3

A 20 mL quantum dot growth solution containing 100 nano-mole of quantum dots is diluted with 20 mL toluene. The QDs are precipitated by adding 40 mL ethanol into the solution. The QDs are then isolated by centrifugation and resuspended in 40 mL toluene. Then, 5 mL of bis(2-ethylhexyl)amine is added to this solution and the mixture is heated at 110° C. for 2 hours. Then the QDs are precipitated for the second time by adding 45 mL ethanol. After centrifugation, the precipitated QDs are resuspended in 100 mL cyclohexane. In this example, the concentration of the native (stronger) ligands is greatly reduced by the first precipitate step. The concentration of the added weaker ligands (e.g., bis(2-ethylhexyl)amine) is much higher.

Ligand Exchange Example 4

A 2 mL oleylamine solution is mixed with 10 mL quantum dot growth solution containing 100 nano-mole of QDs. The mixture is heated at 300° C. under nitrogen for 2 hours and then cooled down to room temperature. To the mixture, 20 mL toluene, 30 mL ethanol is added successively to precipitate the QDs. The QDs are resuspended in 10 mL cyclohexane. In this example, the concentration of the weaker ligands (e.g., oleylamine) is only slightly higher than that of the native ligands. The high exchange temperature is the main driving force for the ligand exchange.

FIG. 4C illustrates a second ligand exchange process, according to an embodiment. Plurality of second ligands 410 are replaced by hydrolyzed alkoxysilane 412. The exchange forms a monolayer of hydrolyzed alkoxysilane 412 on the surface of shell 404, according to an embodiment. Any hydrolyzed silane may be used in place of hydrolyzed alkoxysilane 412. Hydrolyzed alkoxysilane 412 replaces plurality of second ligands 410 due to the low binding affinity between plurality of second ligands 410 and zinc-containing shell 404.

The monolayer of hydrolyzed alkoxysilane 412 acts as a nucleation site for the growth of barrier layer 306 shown in FIG. 3C. For example, barrier layer 306 is covalently bonded to shell 404 of InP-based QDs 401 through Zn—O—Si bonds formed when plurality of second ligands 410 are substituted by hydrolyzed alkoxysilane 412. Barrier layer 306 in this example is an oxide, such as silicon dioxide. An example process for forming a silicon dioxide barrier layer is provided below.

A 50 mL NP-5 solution is mixed with 400 mL cyclohexane in a 500 mL bottle for 20 minutes. To this mixture a solution of ligand exchanged InP-based QDs in cyclohexane containing 250 nmol QDs is added. After another 20 minutes of stirring, 3 mL of TEOS is added in 1 minute under rigorous stirring. The mixture is further stirred for 20 minutes and then 6 mL of 30% ammonium hydroxide solution is added in 2-3 minutes under rigorous stirring. After the addition, the stirring is continued for 2 more minutes. Finally, the bottle is capped and set aside without stirring or heating for 24 hours to 7 days. At the end of the reaction, the solvent and unreacted precursors are evaporated at 50° C. under vacuum to yield a silica-coated QDs concentrate in NP-5. The concentrate is further dried at 60° C. under vacuum for 60 minutes to allow moisture to be fully removed. Finally, the silica coated QDs are isolated by precipitation and centrifugation and re-dispersed in toluene to form a stable hydrophobic solution.

FIG. 5A-5D illustrate TEM images of InP-based QDs after encapsulation within silica barrier layers using the reverse microemulsion process described previously. The TEM images were taken using an electron accelerating voltage of 120 kV. The scale bar in each image represents 100 nm. FIG. 5A illustrates InP-based QDs that had their native ligands exchanged with oleic acid before exchanging with hydrolyzed alkoxysilane. FIG. 5B illustrates InP-based QDs that had their native ligands exchanged with oleylamine before exchanging with hydrolyzed alkoxysilane. FIG. 5C illustrates InP-based QDs that had their native ligands exchanged with an oleic acid/oleylamine compound before exchanging with hydrolyzed alkoxysilane. FIG. 5D illustrates InP-based QDs that had their native ligands exchanged with an oleic acid/dodecanethiol mixture before exchanging with hydrolyzed alkoxysilane.

As can be seen from the TEM images, only the InP-based QDs that underwent ligand exchange with oleylamine resulted in successful encapsulation having only a single QD within each silica barrier layer. The QDs that were exchanged with other ligands (seen in FIGS. 5A, 5C, and 5D), were either not incorporated at all or incorporated with multiple QDs in a silica particle.

In some embodiments, the $SiO_2$ coated InP/ZnS/Se QDs without acid etch treatment display a QY between 40% and 70%, between 45% and 70%, between 50% and 70%, between 40% and 65%, between 40% and 60%, between 40% and 50%, between 45% and 55%, or between 55% and 65%. In some embodiments, the acid etch treated $SiO_2$ coated InP/ZnS/Se QDs display a QY between 60% and 80%, between 65% and 80%, between 70% and 80%, between 60% and 75%, or between 65% and 75%.

Example Steps for Forming Barrier Layer Coated Core-Shell QDs

Figure 6:
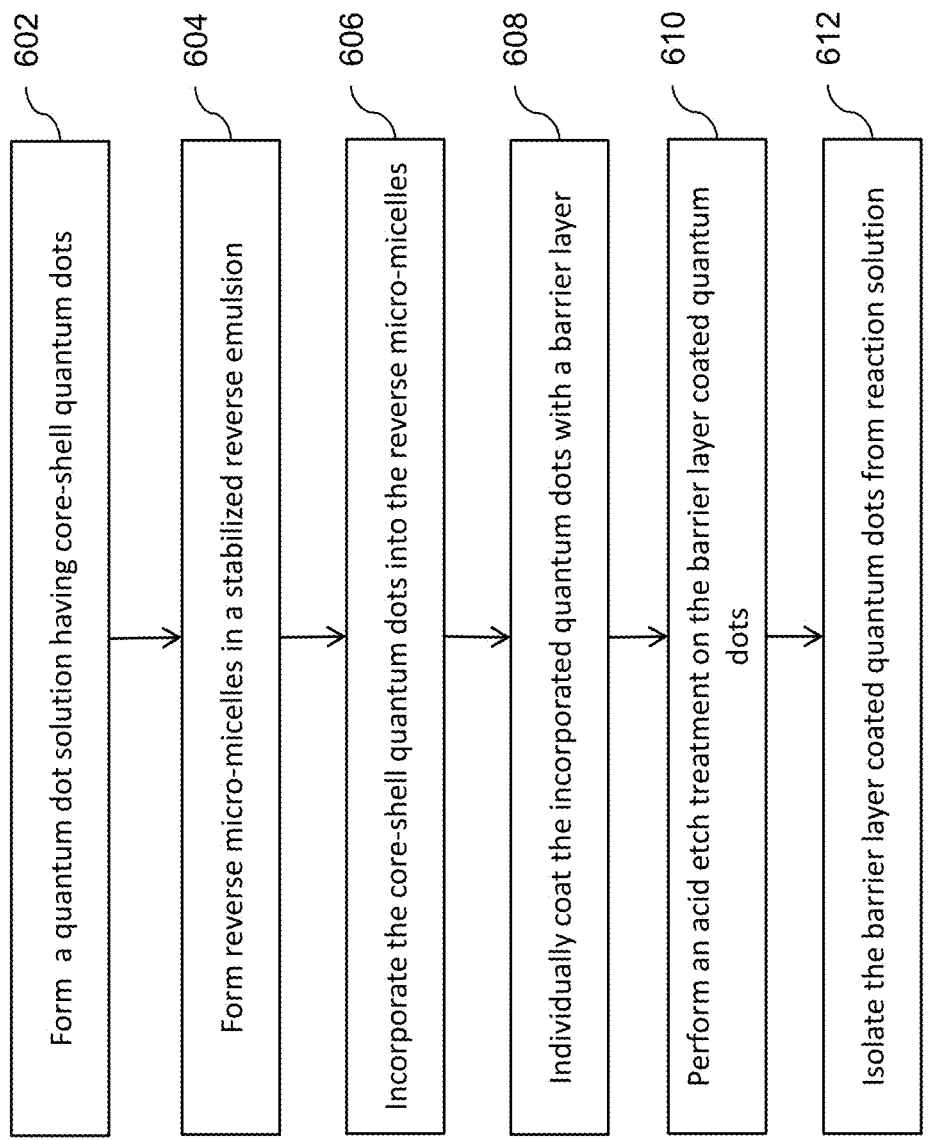
FIG. 6 is a flowchart for forming QDs, according to an embodiment.

FIG. 6 illustrates a flowchart for making barrier layer coated core-shell QDs, according to an embodiment. Method 600 may be performed to form QDs similar to QDs 100, 101, 201, 300, 301, and 401. Method 600 is not intended to be exhaustive and other steps may be performed without deviating from the scope or spirit of the invention. Solely for illustrative purposes, the steps illustrated in FIG. 6 will be described with reference to example processes illustrated in FIGS. 2A-2B and 3A-3C. Steps can be performed in a different order or not performed depending on specific applications.

In step 602, a QD solution having core-shell QDs is formed, according to an embodiment. For example, QD solution having core-shell QDs may be produced by dispersing core-shell QDs such as QDs 101, 201, and/or 301 in a solvent (e.g., cyclohexane, toluene, or hexane).

In step 604, reverse micro-micelles are formed in a stabilized reverse emulsion, according to an embodiment. For example, reverse micro-micelles in a stabilized reverse emulsion may be produced by forming a first mixture of one or more surfactants (e.g., IGEPAL CO-520, IGEPAL CO-630, IGEPAL CA-630, Triton X-100, or Brij 53) with hydrophobic solvents such as, but not limited to, cyclopentane, cyclohexane, or cycloheptane and stirring the first mixture for about 20 min.

In step 606, the core-shell QDs are incorporated into the reverse micro-micelles, according to an embodiment. For example, the core-shell QDs are incorporated into the reverse micro-micelles by forming a second mixture of the QD solution and the first mixture and stirring the second mixture for about 20 min.

In step 608, the incorporated QDs are individually coated with a barrier layer, according to an embodiment. For example, the incorporated QDs are individually coated with a barrier layer by forming a third mixture of one or more precursor solution and the second mixture and stirring the third mixture for about 20 min. The formation of third mixture is followed by forming a fourth mixture of one or more catalysts and the third mixture and stirring the fourth mixture for about 2 min. Following the about 2 min stirring, the bottle including the fourth mixture is capped and stored for 7 days without stirring or heating the fourth mixture.

In step 610, the resulting barrier layer coated QDs are subjected to an acid etch treatment, according to an embodiment. For example, the resulting barrier layer coated QDs are subjected to an acid etch treatment by forming a fifth mixture of one or more acids and the fourth mixture and treating the resulting barrier layer coated QDs in the fifth mixture for about 12 hours. In some embodiments, step 610 may be an optional step.

In step 612, the barrier layer coated QDs are isolated from the fifth mixture, according to an embodiment. For example, the acid etch treated barrier layer coated QDs are isolated by evaporating the solvent, the unreacted precursors, the catalysts, and reaction byproducts at or below a temperature of about 50° C. under vacuum to yield barrier layer coated QDs having surfactants on their outer surfaces similar to, for example, QDs 300 described above. The evaporation is followed by further drying of the acid etch treated barrier layer coated QDs at a temperature of about 60° C. under vacuum for about 60 min to remove substantially all moisture from them. Following the drying, the acid etch treated barrier layer coated QDs are isolated by precipitation and centrifugation.

Example Steps for Performing Ligand Exchange

Figure 7:
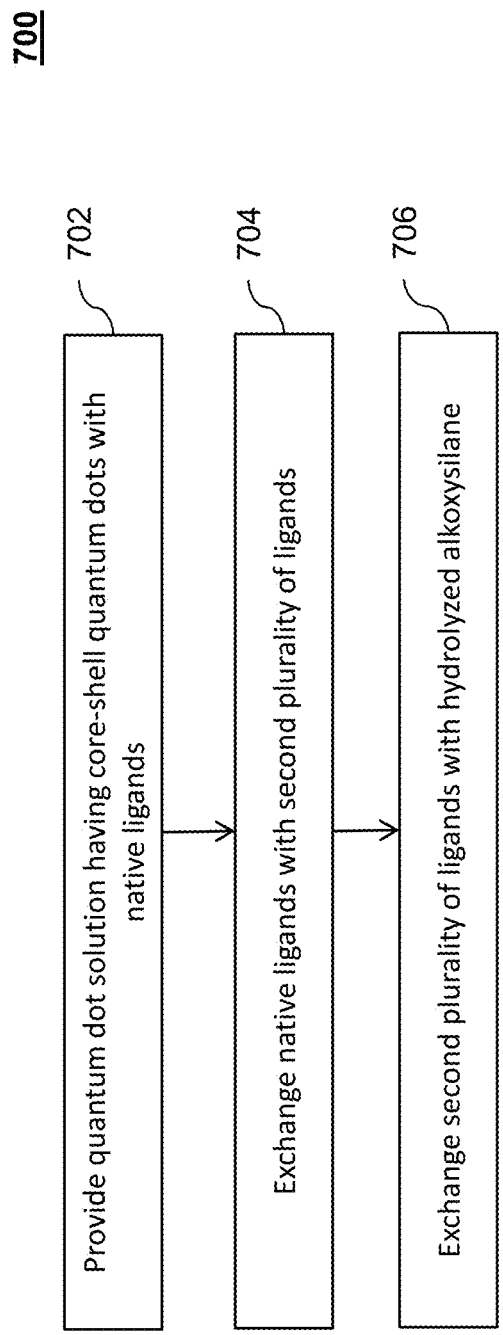
FIG. 7 is a flowchart for performing ligand exchange, according to an embodiment.

FIG. 7 illustrates a flowchart for performing a ligand exchange process on core-shell QDs, according to an embodiment. Method 700 may be performed as part of the process of forming QDs similar to QDs 100 and 300. Method 700 is not intended to be exhaustive and other steps may be performed without deviating from the scope or spirit of the invention. Solely for illustrative purposes, the steps illustrated in FIG. 7 may be described with reference to example processes illustrated in FIGS. 4A-4C. Steps can be performed in a different order or not performed depending on specific applications. According to an embodiment, method 700 is performed following step 602 of method 600, following step 604 of method 600, or following step 606 of method 600. Method 700 may be performed in any situation where it is desirable to replace strongly bound ligands on QDs with more weakly bound ligands in order to facilitate the growth of a barrier layer.

At step 702, quantum dots having a core-shell structure are provided with native ligands on the surface of the shell structure, according to an embodiment. The quantum dots having a core-shell structure may also be formed at step 702 using a process similar to that illustrated in FIGS. 2A and 2B. These core-shell quantum dots may be similar to InP-based QDs 401. Examples of the native ligands include carboxylic acids (such as hexanoic acid, lauric acid, or oleic acid) or alkanethiols (such as octanethiol or dodecanethiol).

At step 704, a first ligand exchange process is performed to exchange the native ligands with a second plurality of ligands, according to an embodiment. The second plurality of ligands may include oleylamine, aliphatic amines, alkylphosphines, polyethylene glycol alkyl ether, or polyethylene glycol aryl ether.

According to an embodiment, the plurality of second ligands have a weaker binding affinity to the shell structure of the quantum dots than the native ligands. In order for weaker-binding ligands to replace stronger-binding ligands, a favorable condition may be created to move the ligand exchange equilibrium forward. This may include increased concentration of the weaker ligands, reduced concentration of the stronger ligands, and/or elevated temperature, etc.

At step 706, a second ligand exchange process is performed to exchange the plurality of second ligands with hydrolyzed alkoxysilane, according to an embodiment. The hydrolyzed alkoxysilane acts as a nucleation center to initiate the growth of an oxide barrier layer, such as a silicon dioxide barrier layer. The growth of the barrier layer is described at step 608 of method 600.

Forming Barrier Layer Using Weakly Bound Native Ligands

InP-based QDs are conventionally synthesized using ligands that are strong Lewis bases, such as carboxylic acid or alkanethiols. According to an embodiment, another process for producing InP-based QDs includes binding native ligands to the zinc-based shell of the InP-based QDs that have a weak binding affinity. In this example, there is no need for performing an intermediary ligand exchange because the weaker-bound ligands can be directly replaced by hydrolyzed alkoxysilane. Examples of ligands that bind weakly to the zinc-based shell of the InP-based QDs include trioctylphosphine (TOP), tributylphosphine, diphenylphosphine, trioctylphosphine oxide, aliphatic amines, aliphatic diamines, polyethylene glycol alkyl ether, polyethylene glycol aryl ether. These InP-based QDs may have a first shell that comprises zinc sulfide, and a second shell that comprises zinc sulfide.

The following is an example process for forming InP-based QDs using TOP as the weakly bound native ligands: 6.0 mL 1-octadecene (ODE) and 3.0 mL trioctylphosphine (TOP) are injected into a 100 mL 3-neck flask at room temperature, and then the reaction temperature is set to 310° C. Once the temperature is stabilized at 310° C., two stock solutions are injected simultaneously into a reactor within 15-30 minutes through syringe pumps. The two stock solutions are prepared separately: Stock 1 is a blend of 2.0 mL ODE, 1.8 mL 2.0 M TOP-Se, and 3 mL of an InP core solution in TOP containing 3600 nmol of InP cores. The first excitonic absorption peak of the InP cores is 580 nm and the average diameter of the cores is about 2.7 nm. Stock 2 is a 8.9 mL 0.5 M stock solution of zinc(II) oleate in TOP. After the injection of the stocks is completed, the reaction is held at 310° C. for 5-15 minutes.

After the 5-15 minute hold, two additional stock solutions (Stock 3 and Stock 4) are injected within 30-60 minutes through syringe pumps. The two stock solutions are prepared separately: Stock 3 is 17.5 mL 0.5 M stock solution of Zn(II) oleate in TOP, Stock 4 is a blend of 16.8 mL of 1.0 M TOP-sulfur solution, 4.0 mL TOP, and 9.5 mL ODE. After the injection, the reaction solution is held at 310° C. for 5-15 minutes and then cooled to room temperature before being transferred into a glove box for purification. The reaction solution is diluted with an equal volume of toluene. Then the diluted solution is mixed with an equal volume of ethanol to precipitate the quantum dots. After centrifugation, the quantum dots are separated and resuspended in cyclohexane for barrier layer coating.

The encapsulation process of the InP-based QDs, that are synthesized using weaker bound ligands, proceeds as described above using hydrolyzed alkoxysilane to act as a nucleation center to initiate the growth of an oxide barrier layer.

An Example Embodiment of a QD Film

Light emitting QDs such as QDs 100 and/or 300 discussed above may be used in a variety of applications that benefit from having sharp, stable, and controllable, and defined angular optical emissions in the visible and infrared spectrum. Such applications may use the light emitting QDs in the form of a QD film 800 as shown in FIG. 8. In some applications, the light emitting QDs may be cast as a QD film 800 on a substrate and patterned by a photolithographic process. Display devices such as organic light emitting diode (OLED) display devices or liquid crystal display (LCD) devices may use such a QD film 800, for example as a color down conversion layer. In such display devices, QD film 800 may be part of their display panel or pixel units of their display panel and may be disposed on light sources or substrates of the display devices, according to some embodiments.

Typically, non-QD based color down conversion layers in display devices can range from about 1 µm to about 10 µm in thickness. In order to achieve similar or higher optical density and QY from QD based color down conversion layers of similar thickness, such as QD film 800, a large density of QDs may need to be loaded and closely packed (i.e., adjacent QDs in substantial contact with each other) within QD film 800 without the QDs being aggregated with each other. However, QDs prepared by current methods tend to aggregate and/or reabsorb emission of adjacent QDs when closely packed in a QD film and consequently, due to quenching of their optical properties, suffer from lower QY compared to non-QD based color down conversion layers. In some embodiments, such problems may be overcome by using QD films of barrier layer coated core-shell QDs such as QDs 100 and/or 300. The barrier layer may help to prevent these QDs from aggregating and reabsorbing each other's emission and consequently, achieve high optical density and QY even when these QDs are closely packed in a QD film of about 1 µm to about 3 µm. The barrier layer of these QDs may also help to protect them from harsh environments (e.g., heat, chemicals) during processing of QD films.

The barrier layer coated core-shell QDs such as QDs 100 and/or 300 in QD films such as QD film 800 may also help to achieve thinner and/or single layered QD-based color conversion optical films compared to current multi-layered QD-based color conversion optical films of QD-based display devices. The thinner and/or single layered QD-based color conversion optical films may meet the requirements for color conversion optical films in today's mobile display applications and/or future display applications such as wearable display devices. Some of these requirements may be for color conversion optical films having a maximum thickness of less than about 75 µm, a defined angular light emission property, and/or a minimal or no edge degradation around perimeters of the color conversion optical films.

The current multi-layered QD-based color conversion optical films are not able to meet such requirements, which may be critical for mobile display applications that require thin as possible components and bezel-free displays. These current multi-layered QD-based optical films include QD films interposed between polymer plastic based substrates that serve as barrier films to protect the QDs in the QD films from ambient environment and/or supporting structures for the QD films. Such use of polymer plastic based substrates make the total thickness of these current optical films equal to or greater than about 175 µm. As the barrier layer coated core-shell QDs such as QDs 100 and/or 300 in QD films such as QD film 800 are individually coated with barrier layers, the use of polymer plastic based substrates can be eliminated. As a result, the thickness of color conversion optical films having QD films such as QD film 800 may be reduced to less than about 75 µm. In some embodiments, QD film 800 may include barrier layer coated core-shell QDs such as QDs 100 and/or 300 embedded in polymer plastic films that are optically transparent to the optical emissions from the embedded QDs. The polymer plastic film may provide mechanical support and additional protection from environment to QD film 800 without increasing its total thickness over the maximum thickness requirement in display applications.

Also, in order to achieve defined angular optical emission additional optical films such as brightness enhancement films (BEFs) may be used in these current optical films, which increases their total thickness over 175 µm. In some embodiment, defined angular optical emission may be achieved in color conversion optical films having QD films such as QD film 800 without using such BEFs. In some embodiments, barrier layer coated core-shell QDs such as QDs 100 and/or 300 may be embedded in BEFs or other optically transparent layers of display devices to form QD films such as QD film 800.

It is to be appreciated that QD films such as QD film 800 including barrier layer coated core-shell QDs such as QDs 100 and/or 300 embedded in polymer plastic films, BEFs, or other optically transparent layers, as discussed above, may not require any additional substrates for casting the barrier coated QDs and/or for supporting the QD films. In some embodiments, QD films such as QD film 800 may be stacked with other optical film and such stack may have a thickness in a range from about 70 µm to about 200 µm.

FIG. 8 illustrates a cross-sectional view of a QD film 800, according to an embodiment. QD film 800 may include a plurality of barrier layer coated core-shell QDs 802 and a matrix material 810, according to an embodiment. QDs 802 may be similar to QDs 100 and/or 300 in structure, function, and/or characteristics and may be embedded or otherwise disposed in matrix material 810, according to some embodiments. In one example QDs 802 include InP-based QDs 401 surrounded by barrier layer 306, where barrier layer 306 is silicon dioxide. In this example, each barrier layer 306 surrounds only a single InP-based QD 401.

As used herein, the term "embedded" is used to indicate that the QDs are enclosed or encased within matrix material 810 that makes up the majority component of the matrix. It should be noted that QDs 802 may be uniformly distributed throughout matrix material 810 in an embodiment, though in other embodiments QDs 802 may be distributed according to an application-specific uniformity distribution function. It should be noted that even though QDs 802 are shown to have the same size in diameter, a person skilled in the art would understand that QDs 802 may have a size distribution. Similar to QDs 300, QDs 802 may have a narrow size distribution and high QY.

In an embodiment, QDs 802 may include a homogenous population of QDs having sizes that emit in the blue visible wavelength spectrum, in the green visible wavelength spectrum, or in the red visible wavelength spectrum. In other embodiments, QDs 802 may include a first population of QDs having sizes that emit in the blue visible wavelength spectrum, a second population of QDs having sizes that emit in the green visible wavelength spectrum, and a third population of QDs that emit in the red visible wavelength spectrum.

Matrix material 810 may be any suitable host matrix material capable of housing QDs 802. For example, BEFs or other optically transparent layer of display devices may be the host matrix material to house QDs 902. Suitable matrix materials may be chemically and optically compatible with QDs 802 and any surrounding packaging materials or layers used in applying QD film 800 to devices. Suitable matrix materials may include non-yellowing optical materials which are transparent to both the primary and secondary light, thereby allowing for both primary and secondary light to transmit through the matrix material. In an embodiment, matrix material 810 may completely surround each of the QDs 802. The matrix material 810 may be flexible in applications where a flexible or moldable QD film 800 is desired. Alternatively, matrix material 810 may include a high mechanical strength, non-flexible material.

In another embodiment, matrix material 810 may have low oxygen and moisture permeability, exhibit high photo- and chemical-stability, exhibit favorable refractive indices, and adhere to outer surfaces of QDs 802, thus providing an air-tight seal to protect QDs 802. In another embodiment, matrix material 810 may be curable with UV or thermal curing methods to facilitate roll-to-roll processing.

Matrix material 810 may include polymers and organic and inorganic oxides. In some embodiments, matrix material 810 may be an extrudable material, that is a material that may be capable of being extruded in a film extrusion process. Suitable polymers for use in matrix material 810 may be any polymer known to the ordinarily skilled artisan that can be used for such a purpose. The polymer may be substantially translucent or substantially transparent. Matrix material 810 may include, but not limited to, epoxies, acrylates, norbornene, polyethylene, poly(vinyl butyral): poly(vinyl acetate), polyurea, polyurethanes, polypropylene, polycarbonate, or a combination thereof; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides which combine with ligand amines (e.g., APS or PEI ligand amines) to form epoxy, and the like. In some embodiments, titanium oxide ($TiO_2$), ZnS, or glass beads are added to matrix material 810 to improve the photo conversion efficiency of QD film 800.

According to some embodiments, QD film 800 may be formed by mixing QDs 802 in a polymer (e.g., photoresist) and casting the QD-polymer mixture on a substrate, mixing QDs 802 with monomers and polymerizing them together, mixing QDs 802 in a sol-gel to form an oxide, or any other method known to those skilled in the art.

According to some embodiments, the formation of QD film 800 may include a film extrusion process as illustrated in FIG. 8A. The film extrusion process may include forming a homogenous mixture 811 of matrix material 810 and barrier layer coated core-shell QDs such as QDs 100 and/or 300, introducing the homogenous mixture 811 into a top mounted hopper 814 that feeds into an extruder 816. In some embodiments, the homogenous mixture 811 may be in the form of pellets. The film extrusion process may further include extruding QD film 800 from a slot die 818 and passing extruded QD film 800 through chill rolls 820. In some embodiments, the extruded QD film 800 may have a thickness less than about 75 µm, for example, in a range from about 70 µm to about 40 µm, from about 65 µm to about 40 µm, from about 60 µm to about 40 µm, or from about 50 µm to about 40 µm. In some embodiments, the formation of QD film 800 may optionally include a secondary process followed by the film extrusion process. The secondary process may include a process such as co-extrusion, thermoforming, vacuum forming, plasma treatment, molding, and/or embossing to provide a texture 813 to a top surface 800s of QD film 800, as shown in a cross-sectional view of QD film 800 in FIG. 8B. The textured top surface 800s of QD film 800 may help to improve, for example defined optical diffusion property and/or defined angular optical emission property of QD film 800.

Example Embodiments of a QD Film Based Display Device

Figure 9:
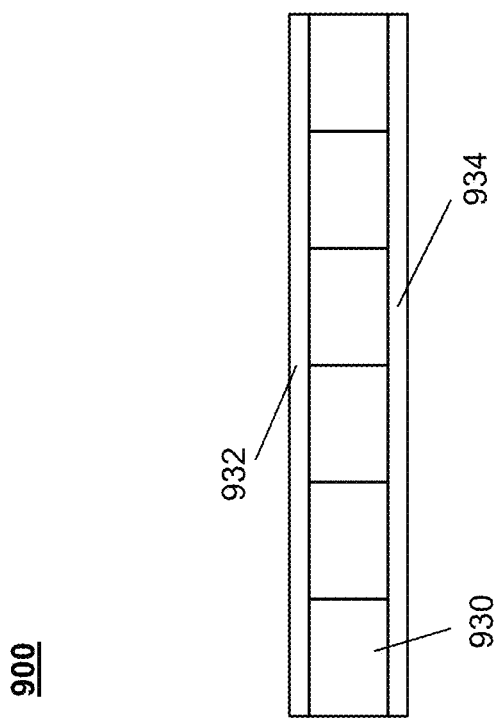
FIG. 9 illustrates a cross-sectional view of a display panel of a display device, according to an embodiment.

FIG. 9 illustrates a schematic of an exploded cross-sectional view of a display panel 900 of a display device, according to an embodiment. In some embodiments, the display device is an OLED display device or LCD device. Display panel 900 may include a plurality of pixel units 930, a transmissive cover plate 932, and a back plate 934, according to an example of this embodiment. Even though FIG. 9 shows display panel 900 having few pixel units 930, a skilled person would understand that display panel 900 of a display device may include an one or two dimensional array of pixel units and any number of pixel units without departing from the general concept of the present invention.

The cover plate 932 may serve as an optically transparent substrate on which other components (e.g., electrode) of the display device may be disposed and/or may act as an optically transparent protective cover for pixel units 930. In some embodiments, pixel units 930 may be tri-chromatic having red, green, and blue sub-pixel units. In some embodiments, pixel units 930 may be monochromatic having either red, green, or blue sub-pixel units. In some embodiments, display panel 900 may have a combination of both tri-chromatic and monochromatic pixel units 930. In some embodiments, pixel units 930 may have two or more sub-pixel units.

Typically, pixel units in display panels have a light source and color filters and light emitted from these pixel units are produced by color filtering of white light sources to produce red, green, and blue pixels in a display device. The use of color filters causes undesired wavelengths, i.e., light energies, to be filtered out. Current display devices have used QD films as a color down conversion film in pixel units to reduce the loss of light energy due to filtering. QDs have a very broad absorption characteristics below their emission wavelength, and as a result may absorb and convert many of the wavelengths radiating from the light source to the desired wavelength of the pixel unit. However, one of the disadvantages of current QD based display devices is that the high optical density and high QY are not achieved with thin QD films of few micrometers or less. The QDs tend to aggregate if they are closely packed in thin QD films as discussed above. Such disadvantage may be overcome with the use QD films such as QD film 800 including barrier layer coated QDs such as QDs 100, 300 and/or 802, discussed above, as color down conversion film in pixel units of display devices.

Figure 10:
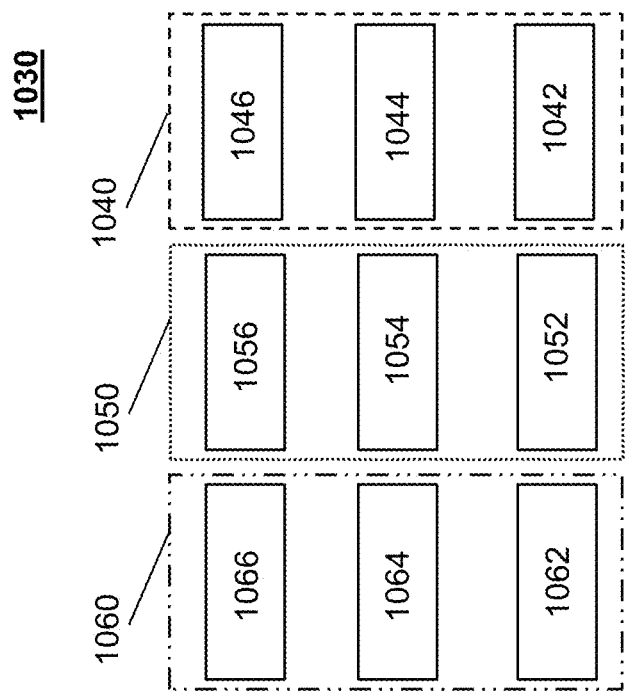
FIG. 10 illustrates a schematic of an exploded cross-sectional view of a QD film based pixel unit of a display device, according to an embodiment.

FIG. 10 illustrates an exploded cross-sectional view of a tri-chromatic pixel unit 1030 of a display panel of a display device, according to an embodiment. In some embodiments, the display device is an OLED display device or LCD device. In an example, pixel unit 1030 may be similar to pixel unit 930 and may be implemented as part of display panel 900. In another example, at least one of the pixel units 930 may have a configuration similar to pixel unit 1030. Pixel unit 1030 may include a red sub-pixel unit 1040, a green sub-pixel unit 1050, and a blue sub-pixel unit 1060. Red sub-pixel unit 1040 may include a white or blue light source 1042, a QD film 1044 including red-emitting QDs (e.g., QDs 100, 300, 802) disposed on an emitting surface of the light source 1042, and an optically transparent substrate 1046. In some embodiments, light source 1042 and QD film 1044 are substantially in contact with each other. As the red-emitting QDs of QD film 1044 may absorb substantially all wavelengths (i.e., substantially all light energy) radiating from the light source 1042, the use of a red color filter to block out non-red wavelengths radiating from the light source may be eliminated in red sub-pixel unit 1040, according to an embodiment. In some embodiments, the white light source 1042 is a white OLED or a white LED. The white OLED may include an organic layer configured to emit white light.

Green sub-pixel unit 1050 may include a white or blue light source 1052, a QD film 1054 including green-emitting QDs (e.g., QDs 100, 300, 802) disposed on an emitting surface of the light source 1052, and a green color filter 1056. In some embodiments, light source 1052 and QD film 1054 are substantially in contact with each other and QD film 1054 and filter 1056 are substantially in contact with each other. The green-emitting QDs of QD film 1054 may absorb substantially all wavelengths smaller and pass substantially all wavelengths higher than their emission wavelength radiating from the light source 1052. As such, a green color filter 1056 may be used in green sub-pixel unit 1050 to filter out the higher wavelengths (e.g., wavelength corresponding to red light), according to an embodiment. In some embodiments, the white light source 1052 is a white OLED or a white LED.

Blue sub-pixel unit 1060 may include a white light source 1062, an optically transparent substrate 1064 and a blue color filter 1066. A blue color filter 1066 may be used in blue sub-pixel unit 1060 to filter out wavelengths radiating from the light source that are higher than blue emission wavelength (e.g., wavelengths corresponding to red and/or green light), according to an embodiment. In an embodiment, the white light source is a white OLED. In an alternate embodiment, blue sub-pixel unit 1060 may include a UV light source 1062, a QD film 1054 including blue-emitting QDs (e.g., QDs 100, 300, 802) disposed on an emitting surface of the light source 1062, and a blue color filter 1066. In some embodiments, light source 1062 and QD film 1064 are substantially in contact with each other and QD film 1064 and filter 1066 are substantially in contact with each other. The blue-emitting QDs of QD film 1064 may absorb substantially all wavelengths smaller and pass substantially all wavelengths higher than their emission wavelength radiating from the light source 1062. As such, a blue color filter 1066 may be used in blue sub-pixel unit 1060 to filter out the higher wavelengths (e.g., wavelengths corresponding to red and/or green light), according to an embodiment. In some embodiments, the UV light source is a UV LED.

The invention also provides a QD-based light emitting diode (LED) comprising a light source unit, a QD film such as QD film 800 comprising a population of barrier layer coated QDs such as QDs 100 and/or 300 disposed on the light source unit, and an optical element disposed on the film layer, according to an embodiment. The light source unit may be configured to emit light at a primary emission peak wavelength smaller than a primary emission peak wavelength emitted by the population of barrier layer coated QDs.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications of such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A quantum dot film comprising:
    quantum dots, each of the quantum dots including:
        a core-shell structure having a core comprising indium phosphide (InP) and a shell comprising zinc sulfide (ZnS) or zinc selenide (ZnSe) surrounding the core, and
        an optically transparent hydrophobic barrier layer, disposed on the core-shell structure, wherein the optically transparent hydrophobic barrier layer surrounds only a single quantum dot; and
    a matrix material configured to house the quantum dots and be in substantial contact with the optically transparent hydrophobic barrier layer, wherein the matrix material includes an extrudable material.

2. The quantum dot film of claim 1, wherein the optically transparent hydrophobic barrier layer comprises an oxide.

3. The quantum dot film of claim 2, wherein the optically transparent hydrophobic barrier layer comprises silicon dioxide.

4. The quantum dot film of claim 1, further comprising surfactants disposed on an outer surface of the optically transparent hydrophobic barrier layer.

5. The quantum dot film of claim 1, wherein the matrix material includes a brightness enhancement film.

6. The quantum dot film of claim 1, wherein the matrix material includes a polymer plastic based substrate.

7. The quantum dot film of claim 1, further comprises a thickness in a range from about 70 μm to about 40 μm.

* * * * *